United States Patent
Kamata

(10) Patent No.: US 11,600,337 B2
(45) Date of Patent: Mar. 7, 2023

(54) MEMORY DEVICE READ OPERATIONS

(71) Applicant: MICRON TECHNOLOGY, INC., Boise, ID (US)

(72) Inventor: Yoshihiko Kamata, Yokohama (JP)

(73) Assignee: Micron Technology, Inc., Boise, ID (US)

(*) Notice: Subject to any disclaimer, the term of this patent is extended or adjusted under 35 U.S.C. 154(b) by 108 days.

(21) Appl. No.: 17/203,830

(22) Filed: Mar. 17, 2021

(65) Prior Publication Data

US 2022/0301634 A1 Sep. 22, 2022

(51) Int. Cl.
| G11C 7/00 | (2006.01) |
| G11C 16/26 | (2006.01) |
| G11C 16/04 | (2006.01) |
| G11C 16/30 | (2006.01) |

(52) U.S. Cl.
CPC .......... *G11C 16/26* (2013.01); *G11C 16/0483* (2013.01); *G11C 16/30* (2013.01)

(58) Field of Classification Search
CPC ....... G11C 7/1051; G11C 7/1078; G11C 7/22; G11C 7/106; G11C 7/1057
USPC .................................................... 365/189.05
See application file for complete search history.

(56) References Cited

U.S. PATENT DOCUMENTS

| 5,508,960 A * | 4/1996 | Pinkham | ................. G11C 8/16 365/207 |
| 7,545,693 B2 * | 6/2009 | Toda | ..................... G11C 16/26 365/205 |
| 9,576,673 B2 | 2/2017 | Jiang et al. | |
| 9,959,078 B2 | 5/2018 | Shah et al. | |
| 2014/0254260 A1 | 9/2014 | Hung et al. | |
| 2019/0164581 A1 * | 5/2019 | Nguyen | ................. G11C 7/08 |

OTHER PUBLICATIONS

International Search Report and Written Opinion of the International Searching Authority for Application No. PCT/US2022/019665 dated Aug. 3, 2022 (19 pages).

* cited by examiner

*Primary Examiner* — Son T Dinh
(74) *Attorney, Agent, or Firm* — Dicke, Billig & Czaja, PLLC

(57) ABSTRACT

Memory devices might include a capacitor, a first capacitance element, a first transistor, and control logic. The first transistor might be connected between the capacitor and the first capacitance element. The control logic might be connected to a control gate of the first transistor. The control logic might be configured to activate the first transistor to precharge the capacitor and the first capacitance element during a read operation of the memory device. The first capacitance element might be a wire capacitance of a first signal line.

38 Claims, 14 Drawing Sheets

MEMORY DEVICE READ OPERATIONS

TECHNICAL FIELD

The present disclosure relates generally to memory and, in particular, in one or more embodiments, the present disclosure relates to read operations within memory devices.

BACKGROUND

Memories (e.g., memory devices) are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor may be connected to a source, while each drain select transistor may be connected to a data line, such as column bit line. Variations using more than one select gate between a string of memory cells and the source, and/or between the string of memory cells and the data line, are known.

DETAILED DESCRIPTION

Figure 1:
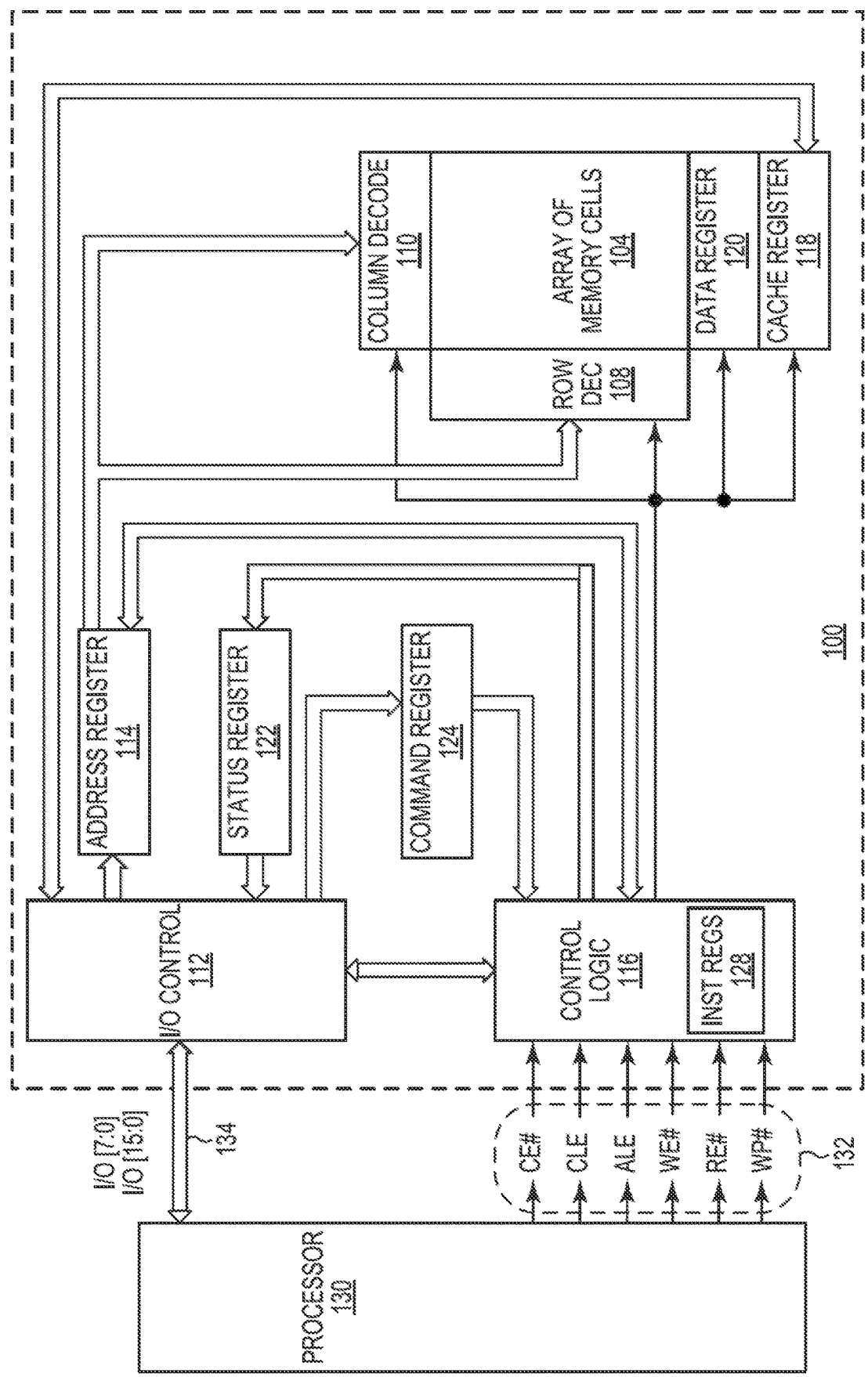
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps might have been utilized to form regions/junctions in the base semiconductor structure, and the term semiconductor can include the underlying layers containing such regions/junctions.

The term "conductive" as used herein, as well as its various related forms, e.g., conduct, conductively, conducting, conduction, conductivity, etc., refers to electrically conductive unless otherwise apparent from the context. Similarly, the term "connecting" as used herein, as well as its various related forms, e.g., connect, connected, connection, etc., refers to electrically connecting unless otherwise apparent from the context.

It is recognized herein that even where values might be intended to be equal, variabilities and accuracies of industrial processing and operation might lead to differences from their intended values. These variabilities and accuracies will generally be dependent upon the technology utilized in fabrication and operation of the integrated circuit device. As such, if values are intended to be equal, those values are deemed to be equal regardless of their resulting values.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones and the like. The processor 130, e.g., a controller external to the memory device 100, might be a memory controller or other external host device.

Memory device 100 includes an array of memory cells 104 that might be logically arranged in rows and columns. Memory cells of a logical row are typically connected to the same access line (commonly referred to as a word line) while memory cells of a logical column are typically selectively connected to the same data line (commonly referred to as a bit line). A single access line might be associated with more than one logical row of memory cells and a single data line might be associated with more than one logical column. Memory cells (not shown in FIG. 1) of at least a portion of array of memory cells 104 are capable of being programmed to one of at least two target data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller (e.g., the control logic 116 internal to the memory device 100) controls access to the array of memory cells 104 in response to the commands and may generate status information for the external processor 130, i.e., control logic 116 is configured to perform access operations (e.g., sensing operations [which might include read operations and verify operations], programming operations and/or erase operations) on the array of memory cells 104. The control logic 116 is in communication with row decode circuitry 108 and column decode circuitry 110 to control the row decode circuitry 108 and column decode circuitry 110 in response to the addresses. The control logic 116 might include instruction registers 128 which might represent computer-usable memory for storing computer-readable instructions. For some embodiments, the instruction registers 128 might represent firmware. Alternatively, the instruction registers 128 might represent a grouping of memory cells, e.g., reserved block(s) of memory cells, of the array of memory cells 104.

Control logic 116 might also be in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data might be passed from the cache register 118 to the data register 120 for transfer to the array of memory cells 104; then new data might be latched in the cache register 118 from the I/O control circuitry 112. During a read operation, data might be passed from the cache register 118 to the I/O control circuitry 112 for output to the external processor 130; then new data might be passed from the data register 120 to the cache register 118. The cache register 118 and/or the data register 120 might form (e.g., might form a portion of) a page buffer of the memory device 100. A page buffer might further include sensing devices (not shown in FIG. 1) to sense a data state of a memory cell of the array of memory cells 104, e.g., by sensing a state of a data line connected to that memory cell. A status register 122 might be in communication with I/O control circuitry 112 and control logic 116 to latch the status information for output to the processor 130.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) might be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands might be received over input/output (I/O) pins [7:0] of I/O bus 134 at I/O control circuitry 112 and might then be written into command register 124. The addresses might be received over input/output (I/O) pins [7:0] of I/O bus 134 at I/O control circuitry 112 and might then be written into address register 114. The data might be received over input/output (I/O) pins [7:0] for an 8-bit device or input/output (I/O) pins [15:0] for a 16-bit device at I/O control circuitry 112 and then might be written into cache register 118. The data might be subsequently written into data register 120 for programming the array of memory cells 104. For another embodiment, cache register 118 might be omitted, and the data might be written directly into data register 120. Data might also be output over input/output (I/O) pins [7:0] for an 8-bit device or input/output (I/O) pins [15:0] for a 16-bit device. Although reference might be made to I/O pins, they might include any conductive nodes providing for electrical connection to the memory device 100 by an external device (e.g., processor 130), such as conductive pads or conductive bumps as are commonly used.

It will be appreciated by those skilled in the art that additional circuitry and signals can be provided, and that the memory device 100 of FIG. 1 has been simplified. It should be recognized that the functionality of the various block components described with reference to FIG. 1 might not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins (or other I/O node structures) might be used in the various embodiments.

Figure 2A:
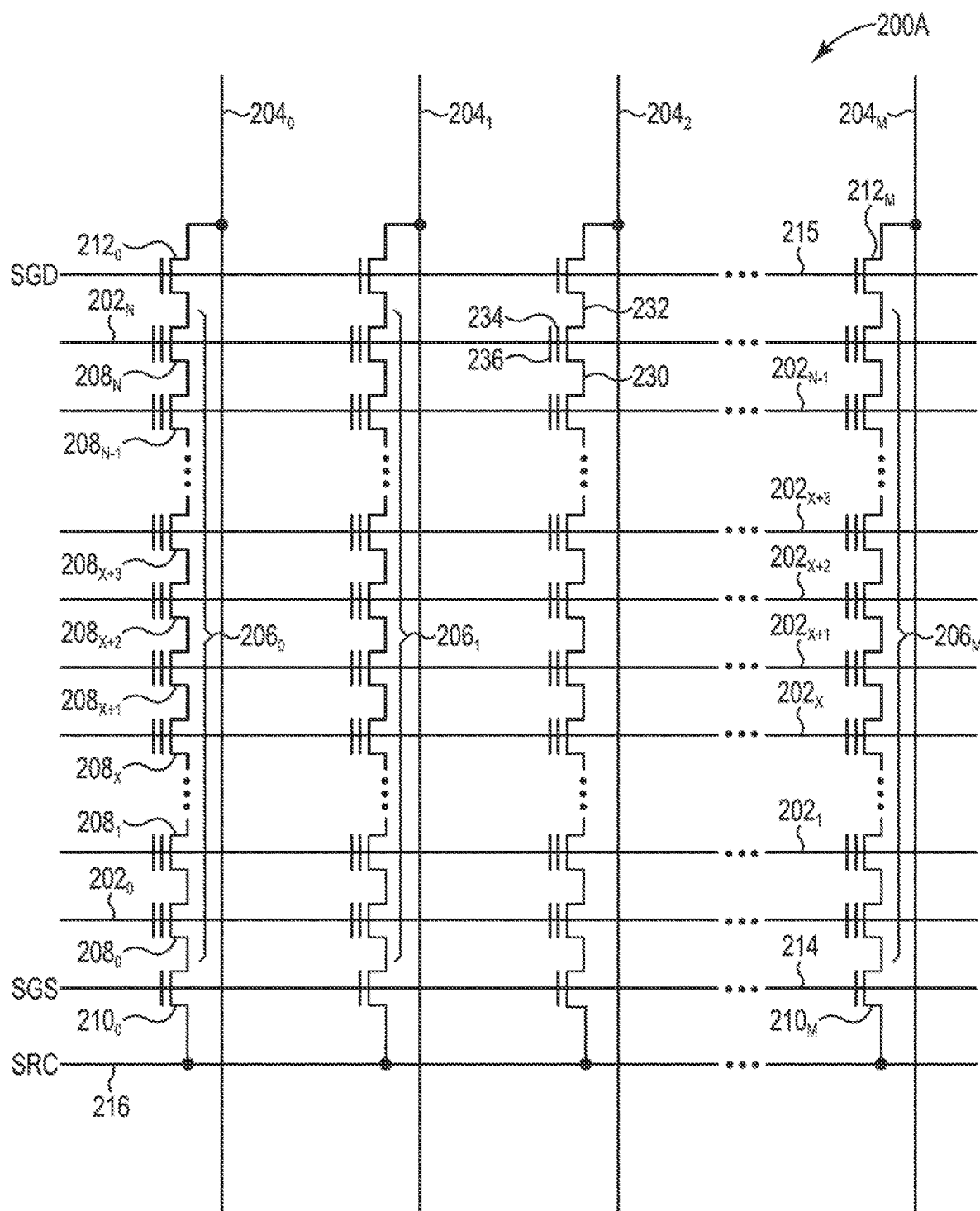
FIGS. 2A-2C are schematics of portions of an array of memory cells as could be used in a memory of the type described with reference to FIG. 1.

FIG. 2A is a schematic of a portion of an array of memory cells 200A, such as a NAND memory array, as could be used in a memory of the type described with reference to FIG. 1, e.g., as a portion of array of memory cells 104. Memory array 200A includes access lines (e.g., word lines) $202_0$ to $202_N$, and data lines (e.g., bit lines) $204_0$ to $204_M$. The access lines 202 might be connected to global access lines (e.g., global word lines), not shown in FIG. 2A, in a many-to-one relationship. For some embodiments, memory array 200A might be formed over a semiconductor that, for example, might be conductively doped to have a conductivity type, such as a p-type conductivity, e.g., to form a p-well, or an n-type conductivity, e.g., to form an n-well.

Memory array 200A might be arranged in rows (each corresponding to an access line 202) and columns (each corresponding to a data line 204). Each column might include a string of series-connected memory cells (e.g., non-volatile memory cells), such as one of NAND strings $206_0$ to $206_M$. Each NAND string 206 might be connected (e.g., selectively connected) to a common source (SRC) 216 and might include memory cells $208_0$ to $208_N$. The memory cells 208 might represent non-volatile memory cells for storage of data. The memory cells $208_0$ to $208_N$ might include memory cells intended for storage of data, and might further include other memory cells not intended for storage of data, e.g., dummy memory cells. Dummy memory cells are typically not accessible to a user of the memory, and are instead typically incorporated into the string of series-connected memory cells for operational advantages that are well understood.

The memory cells 208 of each NAND string 206 might be connected in series between a select gate 210 (e.g., a field-effect transistor), such as one of the select gates $210_0$ to $210_M$ (e.g., that might be source select transistors, commonly referred to as select gate source), and a select gate 212 (e.g., a field-effect transistor), such as one of the select gates $212_0$ to $212_M$ (e.g., that might be drain select transistors, commonly referred to as select gate drain). Select gates $210_0$ to $210_M$ might be commonly connected to a select line 214, such as a source select line (SGS), and select gates $212_0$ to $212_M$ might be commonly connected to a select line 215, such as a drain select line (SGD). Although depicted as traditional field-effect transistors, the select gates 210 and 212 might utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the data line 204 for the corresponding NAND string 206. For example, the drain of select gate $212_0$ might be connected to the data line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the corresponding data line 204. A control gate of each select gate 212 might be connected to select line 215.

The memory array in FIG. 2A might be a quasi-two-dimensional memory array and might have a generally planar structure, e.g., where the common source 216, NAND strings 206 and data lines 204 extend in substantially parallel planes. Alternatively, the memory array in FIG. 2A might be a three-dimensional memory array, e.g., where NAND strings 206 might extend substantially perpendicular to a plane containing the common source 216 and to a plane containing the data lines 204 that might be substantially parallel to the plane containing the common source 216.

Typical construction of memory cells 208 includes a data-storage structure 234 (e.g., a floating gate, charge trap, or other structure configured to store charge) that can determine a data state of the memory cell (e.g., through changes in threshold voltage), and a control gate 236, as shown in FIG. 2A. The data-storage structure 234 might include both conductive and dielectric structures while the control gate 236 is generally formed of one or more conductive materials. In some cases, memory cells 208 might further have a defined source/drain (e.g., source) 230 and a defined source/drain (e.g., drain) 232. Memory cells 208 have their control gates 236 connected to (and in some cases form) an access line 202.

A column of the memory cells 208 might be a NAND string 206 or a plurality of NAND strings 206 selectively connected to a given data line 204. A row of the memory cells 208 might be memory cells 208 commonly connected to a given access line 202. A row of memory cells 208 can, but need not, include all memory cells 208 commonly connected to a given access line 202. Rows of memory cells 208 might often be divided into one or more groups of physical pages of memory cells 208, and physical pages of memory cells 208 often include every other memory cell 208 commonly connected to a given access line 202. For example, memory cells 208 commonly connected to access line $202_N$ and selectively connected to even data lines 204 (e.g., data lines $204_0$, $204_2$, $204_4$, etc.) might be one physical page of memory cells 208 (e.g., even memory cells) while memory cells 208 commonly connected to access line $202_N$ and selectively connected to odd data lines 204 (e.g., data lines $204_1$, $204_3$, $204_5$, etc.) might be another physical page of memory cells 208 (e.g., odd memory cells). Although data lines $204_3$-$204_5$ are not explicitly depicted in FIG. 2A, it is apparent from the figure that the data lines 204 of the array of memory cells 200A might be numbered consecutively from data line $204_0$ to data line $204_M$. Other groupings of memory cells 208 commonly connected to a given access line 202 might also define a physical page of memory cells 208. For certain memory devices, all memory cells commonly connected to a given access line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells might include those memory cells that are configured to be erased together, such as all memory cells connected to access lines $202_0$-$202_N$ (e.g., all NAND strings 206 sharing common access lines 202). Unless expressly distinguished, a reference to a page of memory cells herein refers to the memory cells of a logical page of memory cells.

Although the example of FIG. 2A is discussed in conjunction with NAND flash, the embodiments and concepts described herein are not limited to a particular array architecture or structure, and can include other structures (e.g., SONOS or other data storage structure configured to store charge) and other architectures (e.g., AND arrays, NOR arrays, etc.).

Figure 2B:
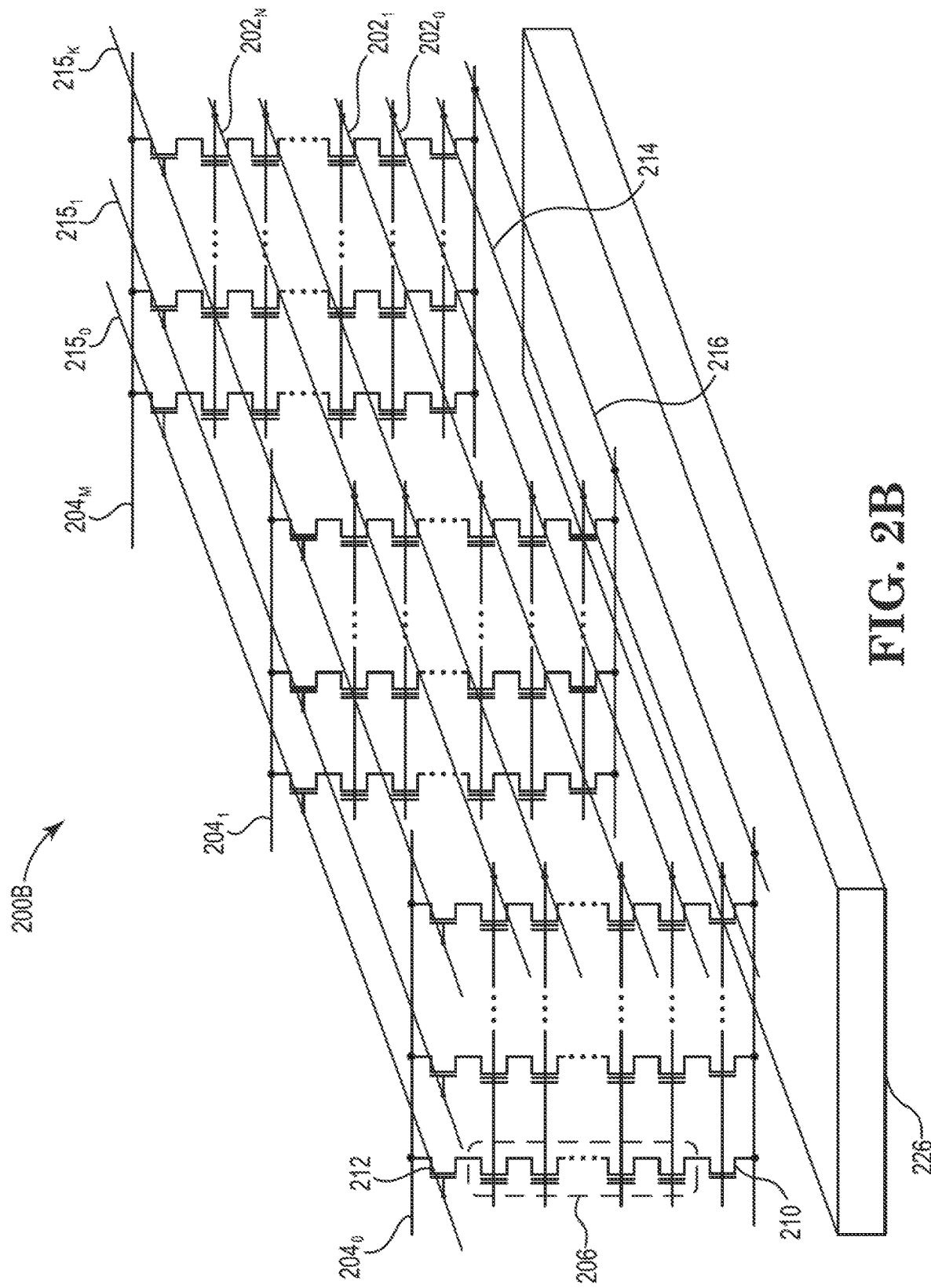

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B might incorporate vertical structures which might include semiconductor pillars where a portion of a pillar might act as a channel region of the memory cells of NAND strings 206. The NAND strings 206 might be each selectively connected to a data line $204_0$ to $204_M$ by a select transistor 212 (e.g., that might be drain select transistors, commonly referred to as select gate drain) and to a common source 216 by a select transistor 210 (e.g., that might be source select transistors, commonly referred to as select gate source). Multiple NAND strings 206 might be selectively connected to the same data line 204. Subsets of NAND strings 206 can be connected to their respective data lines 204 by biasing the select lines $215_0$ to $215_K$ to selectively activate particular select transistors 212 each between a NAND string 206 and a data line 204. The select transistors 210 can be activated by biasing the select line 214. Each access line 202 might be connected to multiple rows of memory cells of the memory array 200B. Rows of memory cells that are commonly connected to each other by a particular access line 202 might collectively be referred to as tiers.

The three-dimensional NAND memory array 200B might be formed over peripheral circuitry 226. The peripheral circuitry 226 might represent a variety of circuitry for accessing the memory array 200B. The peripheral circuitry 226 might include complementary circuit elements. For example, the peripheral circuitry 226 might include both n-channel and p-channel transistors formed on a same semiconductor substrate, a process commonly referred to as CMOS, or complementary metal-oxide-semiconductors. Although CMOS often no longer utilizes a strict metal-oxide-semiconductor construction due to advancements in integrated circuit fabrication and design, the CMOS designation remains as a matter of convenience.

Figure 2C:
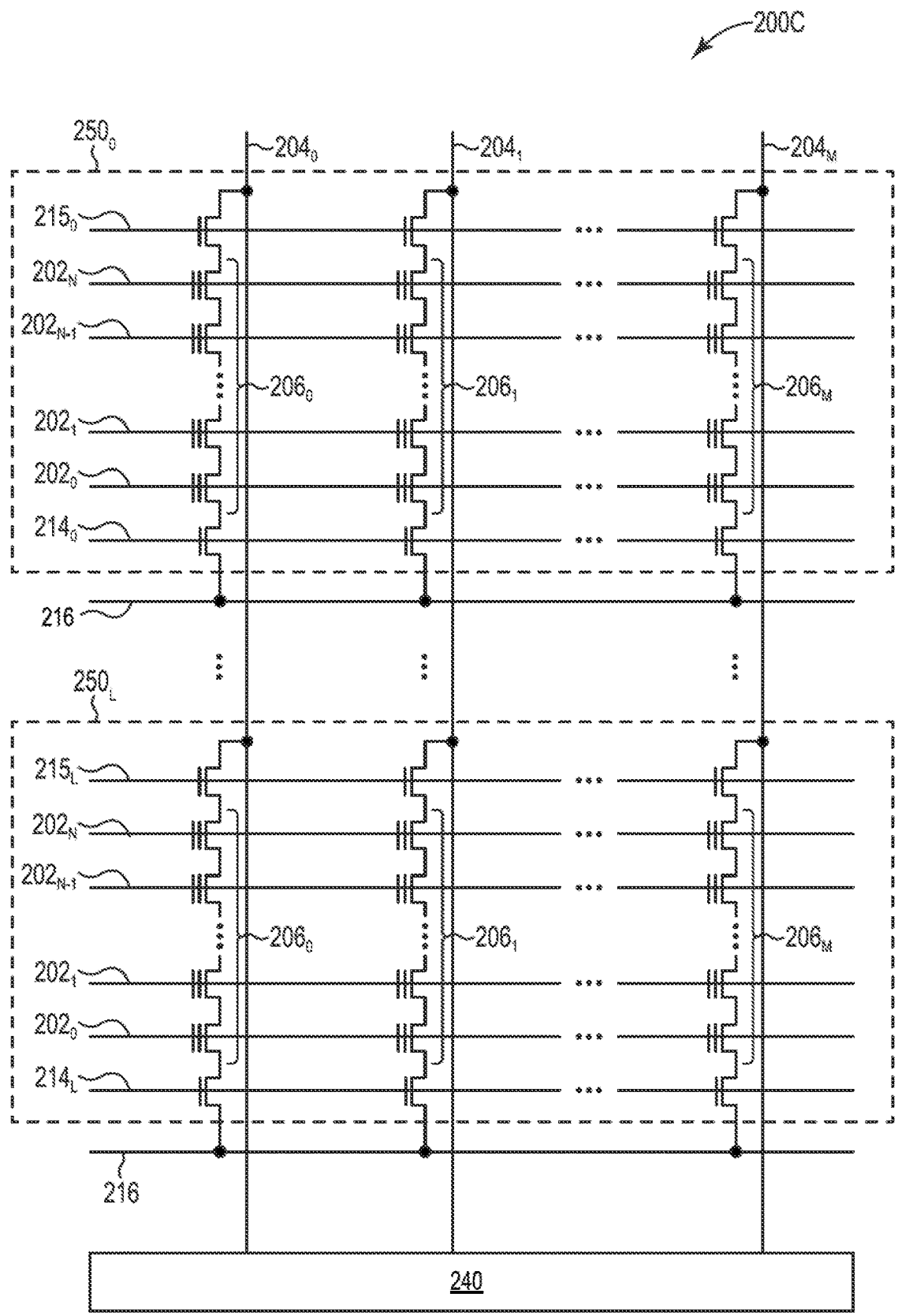

FIG. 2C is a further schematic of a portion of an array of memory cells 200C as could be used in a memory of the type described with reference to FIG. 1, e.g., as a portion of array of memory cells 104. Like numbered elements in FIG. 2C correspond to the description as provided with respect to FIG. 2A. Array of memory cells 200C may include strings of series-connected memory cells (e.g., NAND strings) 206, access (e.g., word) lines 202, data (e.g., bit) lines 204, select lines 214 (e.g., source select lines), select lines 215 (e.g., drain select lines) and source 216 as depicted in FIG. 2A. A portion of the array of memory cells 200A may be a portion of the array of memory cells 200C, for example. FIG. 2C depicts groupings of NAND strings 206 into blocks of memory cells 250, e.g., blocks of memory cells $250_0$ to $250_L$. Blocks of memory cells 250 may be groupings of memory cells 208 that may be erased together in a single erase operation, sometimes referred to as erase blocks. Each block of memory cells 250 might include those NAND strings 206 commonly associated with a single select line 215, e.g., select line $215_0$. The source 216 for the block of memory cells $250_0$ might be a same source as the source 216 for the block of memory cells $250_L$. For example, each block of memory cells $250_0$ to $250_L$ might be commonly selectively connected to the source 216. Access lines 202 and select lines 214 and 215 of one block of memory cells 250 may have no direct connection to access lines 202 and select lines 214 and 215, respectively, of any other block of memory cells of the blocks of memory cells $250_0$ to $250_L$.

The data lines $204_0$ to $204_M$ may be connected (e.g., selectively connected) to a buffer portion 240, which might be a portion of a data buffer of the memory. The buffer portion 240 might correspond to a memory plane (e.g., the set of blocks of memory cells $250_0$ to $250_L$). The buffer portion 240 might include sense circuits (not shown in FIG. 2C) for sensing data values indicated on respective data lines 204.

While the blocks of memory cells 250 of FIG. 2C depict only one select line 215 per block of memory cells 250, the blocks of memory cells 250 might include those NAND strings 206 commonly associated with more than one select line 215. For example, select line $215_0$ of block of memory cells $250_0$ might correspond to the select line $215_0$ of the memory array 200B of FIG. 2B, and the block of memory cells of the memory array 200C of FIG. 2C might further include those NAND strings 206 associated with select lines $215_1$ to $215_K$ of FIG. 2B. In such blocks of memory cells 250 having NAND strings 206 associated with multiple select lines 215, those NAND strings 206 commonly associated with a single select line 215 might be referred to as a sub-block of memory cells. Each such sub-block of memory cells might be selectively connected to the buffer portion 240 responsive to its respective select line 215.

Figure 3A:
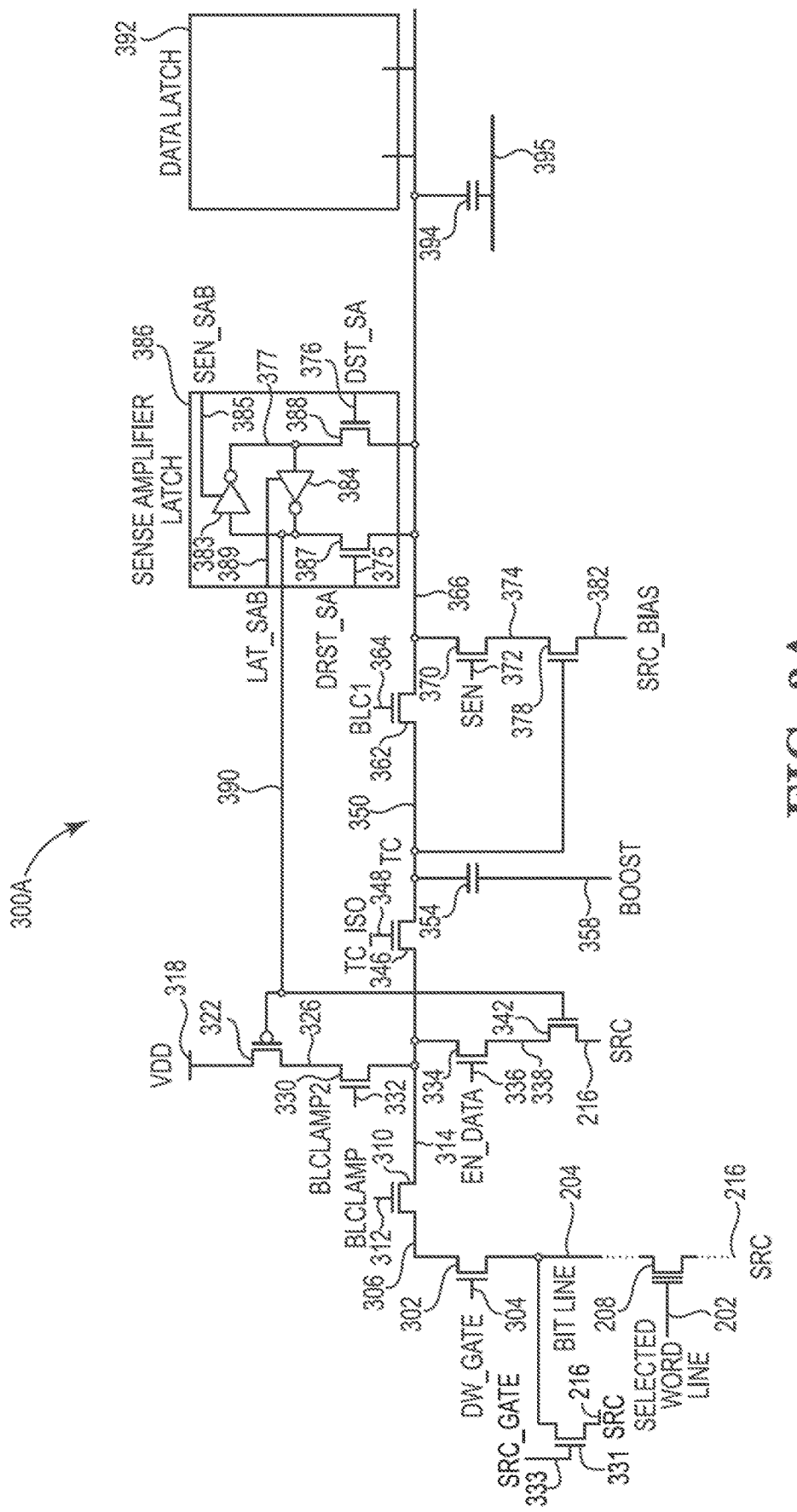
FIGS. 3A and 3B are schematics of portions of a page buffer as could be used in a memory of the type described with reference to FIG. 1.

FIG. 3A is a schematic of portions of a page buffer 300A as could be used in a memory of the type described with reference to FIG. 1. Page buffer 300A might be part of buffer portion 240 of FIG. 2C. Page buffer 300A includes a selected access line (e.g., word line) 202, a selected memory cell 208 of a string of series-connected memory cells (not shown), and a selected data line (e.g., bit line) 204. The selected access line 202 is connected to the control gate of the selected memory cell 208. The source of the selected memory cell 208 is connected to the common source 216 (e.g., via other memory cells of the string of series-connected memory cells and a respective select gate 210). The drain of the selected memory cell 208 is connected to the selected data line 204 (e.g., via other memory cells of the string of series-connected memory cells and a respective select gate 212).

Page buffer 300A also includes transistors 302, 310, 322, 330, 331, 334, 342, 346, 362, 370, and 378, a sense capacitor 354, a sense amplifier latch 386, a data latch 392, and a capacitance element 394. Transistor 322 might be a p-channel metal-oxide-semiconductor (PMOS) transistor, while transistors 302, 310, 330, 331, 334, 342, 346, 362, 370, and 378 might be n-channel metal-oxide-semiconductor (NMOS) transistors. Sense amplifier latch 386 includes inverters 383 and 384 and transistors 387 and 388 (e.g., NMOS transistors). The data line 204 is connected to one side of the source-drain path of transistor 302 and one side of the source-drain path of transistor 331. The gate of transistor 331 is connected to a SRC_GATE control signal path 333. The other side of the source-drain path of transistor 331 is connected to the common source 216. The gate of transistor 302 is connected to a DW_GATE control signal path 304. The other side of the source-drain path of transistor 302 is connected to one side of the source-drain path of transistor 310 through a signal path 306. The gate of transistor 310 is connected to a BLCLAMP control signal path 312. The other side of the source-drain path of transistor 310 is connected to one side of the source-drain path of transistor 330, one side of the source-drain path of transistor 334, and one side of the source-drain path of transistor 346 through a signal path 314. The gate of transistor 330 is connected to a BLCLAMP2 control signal path 332. The other side of the source-drain path of transistor 330 is connected to one side of the source-drain path of transistor 322 through a signal path 326. The gate of transistor 322 is connected to the input of inverter 383, the output of inverter 384, one side of the source-drain path of transistor 387, and the gate of transistor 342 through a signal path 390. The other side of the source-drain path of transistor 322 is connected to a supply node (e.g., VDD) 318. The gate of transistor 334 is connected to an EN_DATA control signal path 336. The other side of the source-drain path of transistor 334 is connected to one side of the source-drain path of transistor 342 through a signal path 338. The other side of the source-drain path of transistor 342 is connected to the common source 216.

The gate of transistor 346 is connected to a TC_ISO control signal path 348. The other side of the source-drain path of transistor 346 is connected to one side of sense capacitor 354, one side of the source-drain path of transistor 362, and the gate of transistor 378 through a TC signal path 350. The other side of sense capacitor 354 is connected to a sense capacitor bias node (e.g., BOOST node) 358. The gate of transistor 362 is connected to a BLC1 control signal path 364. The other side of the source-drain path of transistor 362 is connected to one side of the source-drain path of transistor 370, the other side of the source-drain path of transistor 387, one side of the source-drain path of transistor 388, data latch 392, and one side of capacitance element 394 through a signal path 366. The other side of capacitance element 394 might be connected to a signal line 395. The gate of transistor 370 is connected to a SEN control signal path 372. The other side of the source-drain path of transistor 370 is connected to one side of the source-drain path of transistor 378 through a signal path 374. The other side of the source-drain path of transistor 378 is connected to a source bias node (e.g., SRC_BIAS) 382. The transistor 378 might be referred to as a sense transistor.

The gate of transistor 387 of sense amplifier latch 386 is connected to a DRST_SA control signal path 375. The gate of transistor 388 is connected to a DST_SA signal path 376. The other side of the source-drain path of transistor 388 is connected to the output of inverter 383 and to the input of inverter 384 through a signal path 377. A control input of inverter 383 is connected to a SEN_SAB control signal path 385. A control input of inverter 384 is connected to a LAT_SAB control signal path 389.

Control logic (e.g., 116 of FIG. 1) might be connected to the SRC_GATE control signal path 333, the DW_GATE control signal path 304, the BLCLAMP control signal path 312, the BLCLAMP2 control signal path 332, the EN_DATA control signal path 336, the TC_ISO control signal path 348, the BLC1 control signal path 364, the SEN control signal path 372, the LAT_SAB control signal path 389, the SEN_SAB control signal path 385, the DRST_SA control signal path 375, and the DST_SA control signal path 376 to control the operation of page buffer 300A. The control logic may activate transistor 331 to selectively connect the data line 204 to the common source 216. The control logic may activate transistor 302 to selectively connect the data line 204 to the signal path 306. The control logic may activate transistor 310 to selectively connect the signal path 306 to the signal path 314. The control logic may activate transistor 330 to selectively connect the signal path 314 to the signal path 326. The control logic may activate transistor 334 to selectively connect the signal path 314 to the signal path 338. The control logic may activate transistor 346 to selectively connect the signal path 314 to the TC signal path 350. The control logic may activate transistor 362 to selectively connect the TC signal path 350 to the signal path 366. The control logic may activate transistor 370 to selectively connect the signal path 366 to signal path 374. The control logic may activate transistor 387 of sense amplifier latch 386 to selectively connect the signal path 366 to the signal path 390. The control logic may activate transistor 388 to selectively connect the signal path 366 to the signal path 377. The control logic may control inverter 383 to latch a sensed state of the selected memory cell in sense amplifier latch 386. The control logic may control inverter 384 to output the latched state from the sense amplifier latch 386.

In one embodiment, capacitance element 394 might be a parasitic capacitance (e.g., wire capacitance) between signal path 366 and signal path 395. In another embodiment, capacitance element 394 might be a capacitor. The capacitance element 394 might have a capacitance less than the capacitance of the capacitor 354. During the operation of page buffer 300A, transistor 362 may be activated such that capacitor 354 and capacitance element 394 are charged and discharged together. Capacitor 354 might be referred to as a sense capacitor as the charge on the capacitor during a sense operation is used to determine the state of the selected memory cell 208. In one example, capacitor 354 might be a depletion-mode metal-oxide-semiconductor (DMOS) capacitor. Capacitor 354 may occupy a relatively large portion of the semiconductor area of page buffer 300A. By utilizing the capacitance element 394 in combination with capacitor 354 during a sense operation, the size of capacitor 354 may be reduced and/or the total capacitance during a sense operation may be increased. Increasing the total capacitance during a sense operation might allow a longer sensing time, which might improve the sensing operation.

Page buffer 300A may be used to sense the state of the selected memory cell 208 and latch the sensed state in sense amplifier latch 386. Page buffer 300A may also be used to program a target state to the selected memory cell 208 based on a state of the sense amplifier latch 386, a state of the data latch 392, and/or the state of other data latches (not shown). Sense operations to determine the state of the selected memory cell 208 are described in more detail below with reference to FIGS. 5 and 6.

Figure 3B:
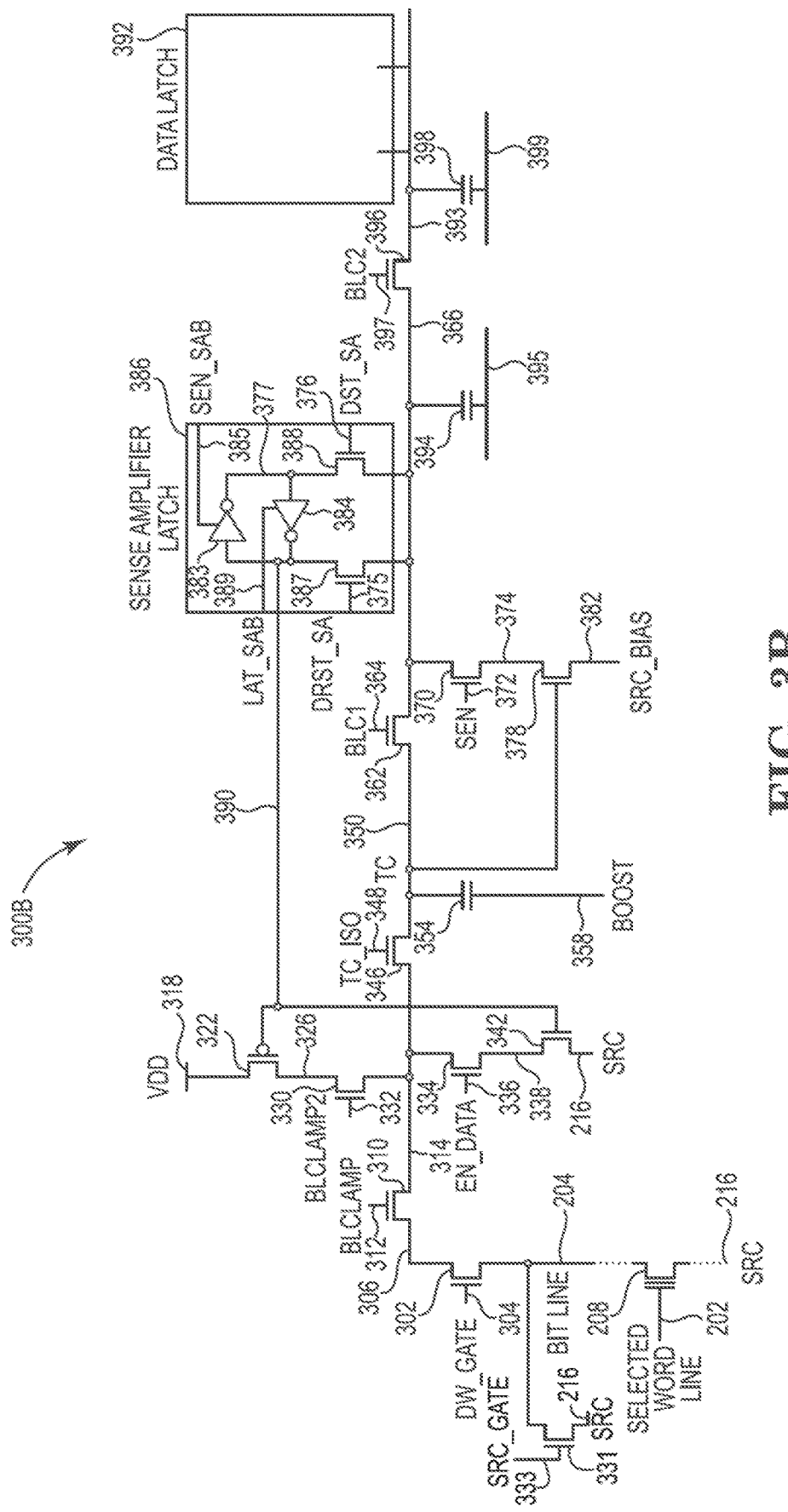

FIG. 3B is a schematic of portions of a page buffer 300B as could be used in a memory of the type described with reference to FIG. 1. Page buffer 300B might be part of buffer portion 240 of FIG. 2C. Page buffer 300B is similar to page buffer 300A previously described and illustrated with reference to FIG. 3A, except that page buffer 300B also includes a transistor 396 and a capacitive element 398. One side of the source-drain path of transistor 396 is connected to signal path 366. The gate of transistor 396 is connected to a BLC2 control signal path 397. The other side of the source-drain path of transistor 396 is connected to one side of capacitance element 398 and data latch 392 through a signal path 393. The other side of capacitance element 398 might be connected to a signal line 399.

Control logic (e.g., 116 of FIG. 1) might be connected to the BLC2 control signal path 397 to control transistor 396. In one embodiment, capacitance element 398 might be a parasitic capacitance (e.g., wire capacitance) between signal path 393 and signal path 399. In another embodiment, capacitance element 398 might be a capacitor. The capacitance element 398 might have a capacitance less than the capacitance of the capacitor 354. During the operation of page buffer 300B, transistors 362 and 396 may be activated such that capacitor 354, capacitance element 394, and capacitance element 398 are charged and discharged together. Capacitor 354 might be referred to as a sense capacitor, capacitance element 394 might be referred to as a first capacitance element, and capacitance element 398 might be referred to as a second capacitance element. Capacitor 354 may occupy a relatively large portion of the semiconductor area of page buffer 300B. By utilizing the first capacitance element 394 and the second capacitance element 398 in combination with capacitor 354 during a sense operation, the size of capacitor 354 may be reduced and/or the total capacitance during a sense operation may be increased. Increasing the total capacitance during a sense operation might allow a longer sensing time, which might improve the sensing operation.

Figure 4:
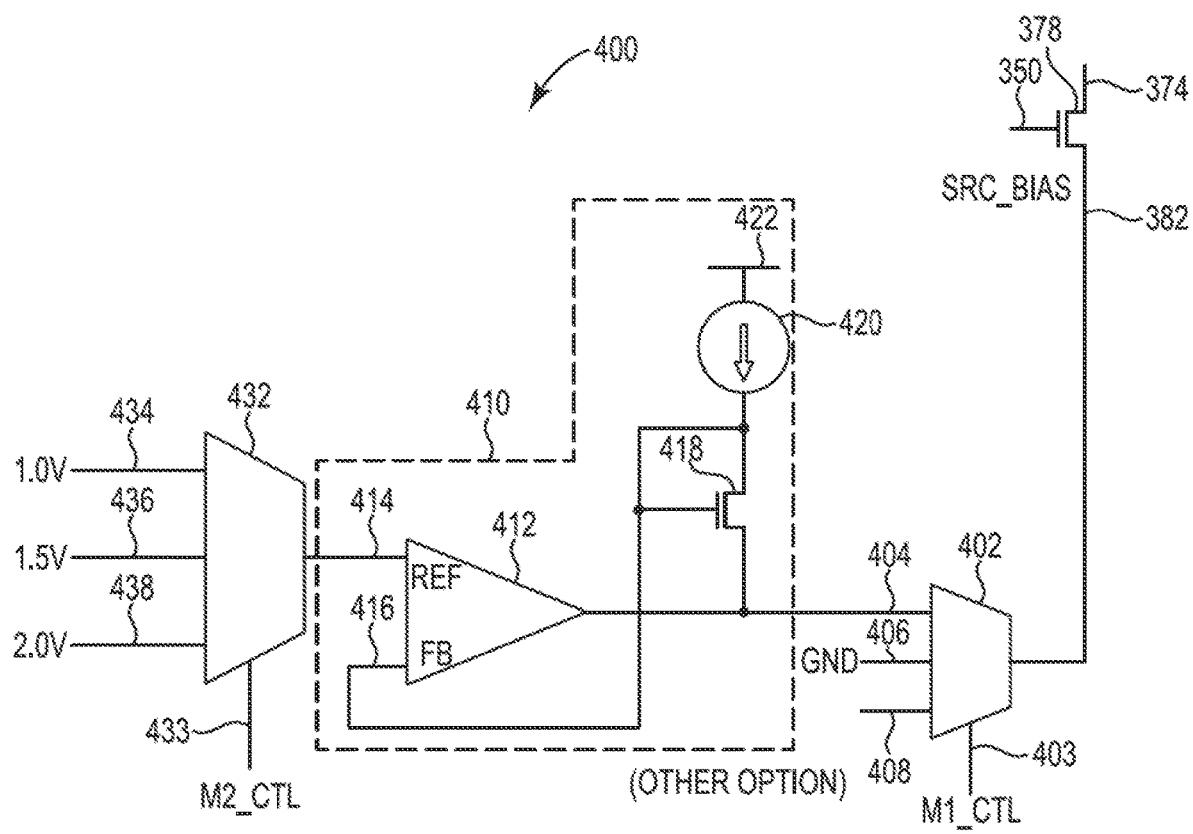
FIG. 4 is a schematic of a biasing circuit as could be used in the page buffer described with reference to FIGS. 3A and 3B.

FIG. 4 is a schematic of a biasing circuit 400 as could be used in the page buffer 300A or 300B described with reference to FIGS. 3A and 3B. Biasing circuit 400 includes a first multiplexer 402, a voltage regulator 410, and a second multiplexer 432. The voltage regulator 410 includes an operational amplifier 412, a regulator transistor 418, and a current source 420. The output of the first multiplexer 402 is connected to the drain of the sense transistor 378 through the SRC_BIAS node 382. A first input of the first multiplexer 402 is connected to a first bias node 404, a second input of the first multiplexer 402 is connected to a second bias node (e.g., GND) 406, and a third input of the first multiplexer 402 is connected to a third bias node (e.g., other option) 408. A control input of the first multiplexer 402 is connected to a M1_CTL signal path 403.

An output of the operational amplifier 412 is connected to the first input of the first multiplexer 402, and one side of the source-drain path of the regulator transistor 418 through the first bias node 404. A feedback input of the operational amplifier is connected to the output of the current source 420, the gate of the regulator transistor 418 and the other side of the source-drain path of the regulator transistor 418 through a feedback signal path 416. The input of the current source 420 is connected to a supply node 422. The output of the second multiplexer 432 is connected to the reference input of the operational amplifier 412 through a reference input signal path 414. A first input of the second multiplexer 432 is connected to a first input voltage node (e.g., 1.0V) 434, a second input of the second multiplexer 432 is connected to a second input voltage node (e.g., 1.5V) 436, and a third input of the second multiplexer 432 is connected to a third input voltage node (e.g., 2.0V) 438. A control input of the second multiplexer 432 is connected to a M2_CTL signal path 433.

The M1_CTL control signal and the M2_CTL control signal may be controlled by control logic (e.g., 116 of FIG. 1) to control the operation of biasing circuit 400. The first multiplexer 402 passes one of the voltages on nodes 404, 406, and 408 to the SRC_BIAS node 382 based on the M1_CTL control signal. The second multiplexer 432 passes one of the voltages on nodes 434, 436, and 438 to the reference input of the operational amplifier 412 based on the M2_CTL control signal.

The regulator transistor 418 might include a threshold voltage equal to the threshold voltage of the sense transistor 378. In this case, the regulated voltage applied to the first bias node 404 equals the selected one of the input voltages on node 434, 436, or 438 minus the threshold voltage of the regulator transistor 418. The threshold voltage of the regulator transistor 418 and the threshold voltage of the sense transistor 378 might remain equal in response to process, voltage, and temperature (PVT) variations. Thus, by utilizing regulator transistor 418 within voltage regulator 410, biasing circuit 400 compensates for any PVT variations of sense transistor 378.

The use of different voltage levels on data lines to be enabled for programming might occur in programming schemes known as selective slow programming convergence (SSPC), where memory cells nearer to their respective intended data states are programmed more slowly (e.g., partially enabled for programming) compared to memory cells farther from their respective intended data states (e.g., fully enabled for programming) while receiving a same voltage level at their respective control gates. As described in more detail below with reference to FIGS. 5 and 6, the third input voltage node 438 might be biased to a sense capacitor precharge voltage (e.g., 2.0V), the second input voltage node 436 might be biased to a target threshold voltage (e.g., 1.5V) for a first sense operation (e.g., during a program verify or read strobe), and the first input voltage node 434 might be biased to a target threshold voltage (e.g., 1.0V) for a second sense operation (e.g., during a SSPC strobe).

Figure 5:
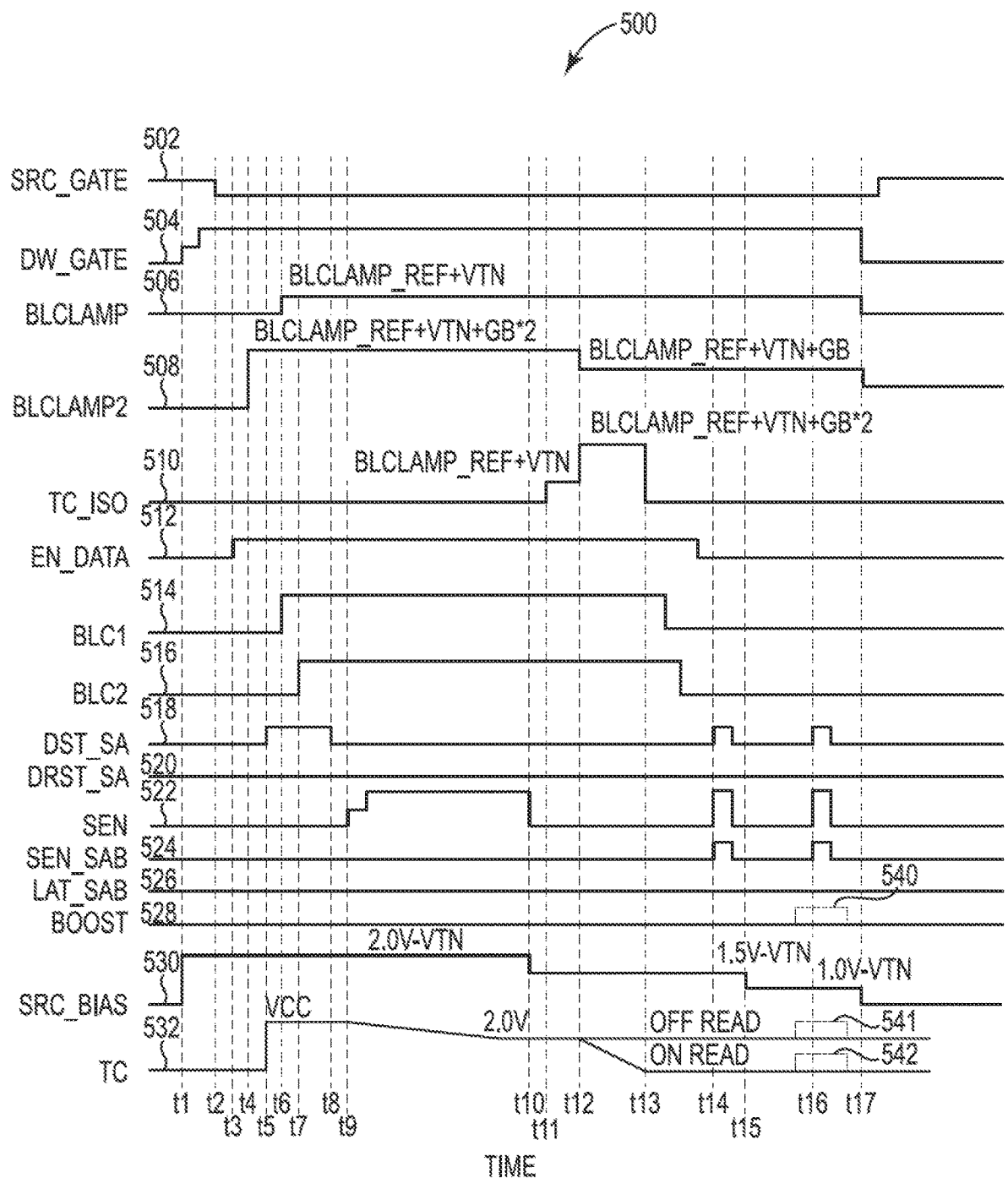
FIG. 5 is a timing diagram depicting a sensing operation according to embodiments.

FIG. 5 is a timing diagram 500 depicting a sensing operation according to embodiments. In FIG. 5, trace 502 might represent a SRC_GATE control signal on signal path 333 of FIGS. 3A and 3B. Trace 504 might represent a DW_GATE control signal on signal path 304 of FIGS. 3A and 3B. Trace 506 might represent a BLCLAMP control signal on signal path 312 of FIGS. 3A and 3B. Trace 508 might represent a BLCLAMP2 control signal on signal path 332 of FIGS. 3A and 3B. Trace 510 might represent a TC_ISO control signal on signal path 348 of FIGS. 3A and 3B. Trace 512 might represent an EN_DATA control signal on signal path 336 of FIGS. 3A and 3B. Trace 514 might represent a BLC1 control signal on signal path 364 of FIGS. 3A and 3B. Trace 516 might represent BLC2 control signal on signal path 397 of FIG. 3B. Trace 518 might represent a DST_SA control signal on signal path 376 of FIGS. 3A and 3B. Trace 520 might represent a DRST_SA control signal on signal path 375 of FIGS. 3A and 3B. Trace 522 might represent a SEN control signal on signal path 372 of FIGS. 3A and 3B. Trace 524 might represent a SEN_SAB control signal on signal path 385 of FIGS. 3A and 3B. Trace 526 might represent a LAT_SAB control signal on signal path 389 of FIGS. 3A and 3B. Trace 528 might represent a BOOST signal on node 358 of FIGS. 3A and 3B. Trace 530 might represent a SRC_BIAS signal on node 382 of FIGS. 3A and 3B as provided by the biasing circuit 400 of FIG. 4. Trace 532 might represent a TC signal on signal path 350 of FIGS. 3A and 3B.

Prior to time t1, a program pulse might be applied to memory cells connected to a selected access line. After the program pulse, a program verify operation might be implemented to determine whether each memory cell connected to the selected access line has been programed to their target level. The signal levels illustrated in FIG. 5 are applicable to either a sense operation corresponding to a program verify operation or a read operation to read data from the array of memory cells.

During the sense operation, DRST_SA and LAT_SAB might remain at a reference voltage (e.g., VSS). In addition, BOOST might also remain at a reference voltage (e.g., GND). At time t1, DW_GATE might be increased to a voltage sufficient to activate the transistor 302 to connect the data line 204 to the signal path 306. Also at time t1, SCR_BIAS might be increased to a sense capacitor precharge voltage (e.g., 2.0V-Vtn, where Vtn is the threshold voltage of the sense transistor 378 of FIGS. 3A and 3B and the regulator transistor 418 of FIG. 4) to bias the source of transistor 378. At time t2, SRC_GATE might be decreased to a voltage sufficient to activate the select transistor 210 to connect the selected memory cell 208 to the common source 216. At time t3, EN_DATA might be increased to a voltage sufficient to activate transistor 334 to connect signal path 314 to signal path 338. At time t4, BLCLAMP2 might be increased to a BLCLAMP_REF+Vtn+GB*2 voltage, where BLCLAMP_REF is the target voltage for the data line 204, Vtn is the threshold voltage of the transistor 330, and GB is a guard band voltage.

At time t5, DST_SA might be increased to a voltage sufficient to activate transistor 388 to connect signal path 377 to signal path 366. Also at time t5, TC might be charged to a precharge voltage (e.g., VCC). At time t6, BLCAMP might be increased to BLCLAMP_REF+Vtn, where Vtn is the threshold voltage of transistor 310, to begin precharging the data line 204. Also at time t6, BLC1 might be increased to a voltage sufficient to activate transistor 362 to connect TC signal path 350 to signal path 366, which connects the first capacitance element 394 with sense capacitor 354. At time t7, BLC2 might be increased to a voltage sufficient to activate transistor 396 to connect signal path 366 to signal path 393, which connects the second capacitance element 398 with the first capacitance element 394 and the sense capacitor 354. For the embodiment of FIG. 3A where the second capacitance element 398 is not included, this step at time t7 may be skipped. At time t8, DST_SA might be decreased to a voltage sufficient to deactivate transistor 388 to disconnect signal path 377 from signal path 366. At time t9, SEN might be increased to a voltage sufficient to activate transistor 370 to connect signal path 366 to signal path 374.

Between times t9 and t10, TC might be discharged to the voltage of SRC_BIAS (e.g., 2.0V). At time t10, SEN might be decreased to a voltage sufficient to deactivate transistor 370 to disconnect signal path 366 from signal path 374. Also at time t10, SRC_BIAS might be decreased to a target threshold voltage (e.g., 1.5V-Vtn) for a first sense operation (e.g., for a program verify or read strobe). At time t11, the precharging of the data line 204 is complete and TC_ISO might be increased to BLCLAMP_REF+Vtn, where Vtn is the threshold voltage of transistor 346. At time t12, TC_ISO might be increased to BLCLAMP_REF+Vtn+GB*2 and BLCLAMP2 might be decreased to BLCLAMP_REF+Vtn+GB to begin sensing the state of the selected memory cell.

Between times t12 and t13, in response to the selected memory cell being in an off state, TC remains substantially constant. In response to the selected memory cell being in an on state, TC is discharged through the selected memory cell. At time t13, the sensing is complete and TC_ISO might be decreased to a voltage sufficient to disconnect signal path 314 from TC signal path 350. Between times t13 and t14, EN_DATA, BLC1, and BLC2 might each be decreased to a voltage sufficient to deactivate transistors 334, 362, and 396, respectively. At time t14, DST_SA, SEN, and SEN_SAB might be pulsed to temporarily activate transistor 388, transistor 370, and inverter 383, respectively, to latch the state of the selected memory cell in sense amplifier latch 386 for a program verify or read operation. In response to TC indicating the memory cell is in an off state, the sense transistor 378 is activated and the sense amplifier latch 386 latches a "0" based on the voltage on signal path 366. In response to TC indicating the memory cell is in an on state, the sense transistor 378 is deactivated and the sense amplifier latch 386 latches a "1" based on the voltage on signal path 366.

Alternatively, at time t15 SCR_BIAS might be decreased to a target threshold voltage (e.g., 1.0V-Vtn) for a second sense operation (e.g., for a SSPC strobe). At time t16, DST_SA, SEN, and SEN_SAB then might be pulsed to temporarily activate transistor 388, transistor 370, and inverter 383, respectively, to latch the state of the selected memory cell in sense amplifier latch 386 for a selective slow program convergence operation. In one example prior to time t16, BOOST might be increased above a reference voltage as indicated at 540 to increase TC as indicated at 541 or 542 prior to latching the state of the selected memory cell in the sense amplifier latch 386 for the selective slow program convergence operation. By increasing BOOST to increase TC, an additional margin might be provided for latching the state of the selected memory cell in the sense amplifier latch 386 for the selective slow program convergence operation. At time t17, DW_GATE, BLCLAMP, and BLCLAMP2 might be decreased to a voltage sufficient to deactivate the transistors 302, 310, and 330, respectively.

Also at time t17, SRC_BIAS might be decreased to a reference voltage (e.g., GND). After time t17, SCR_GATE might be increased to deactivate the select transistor 210 and the sense operation is complete.

Figure 6:
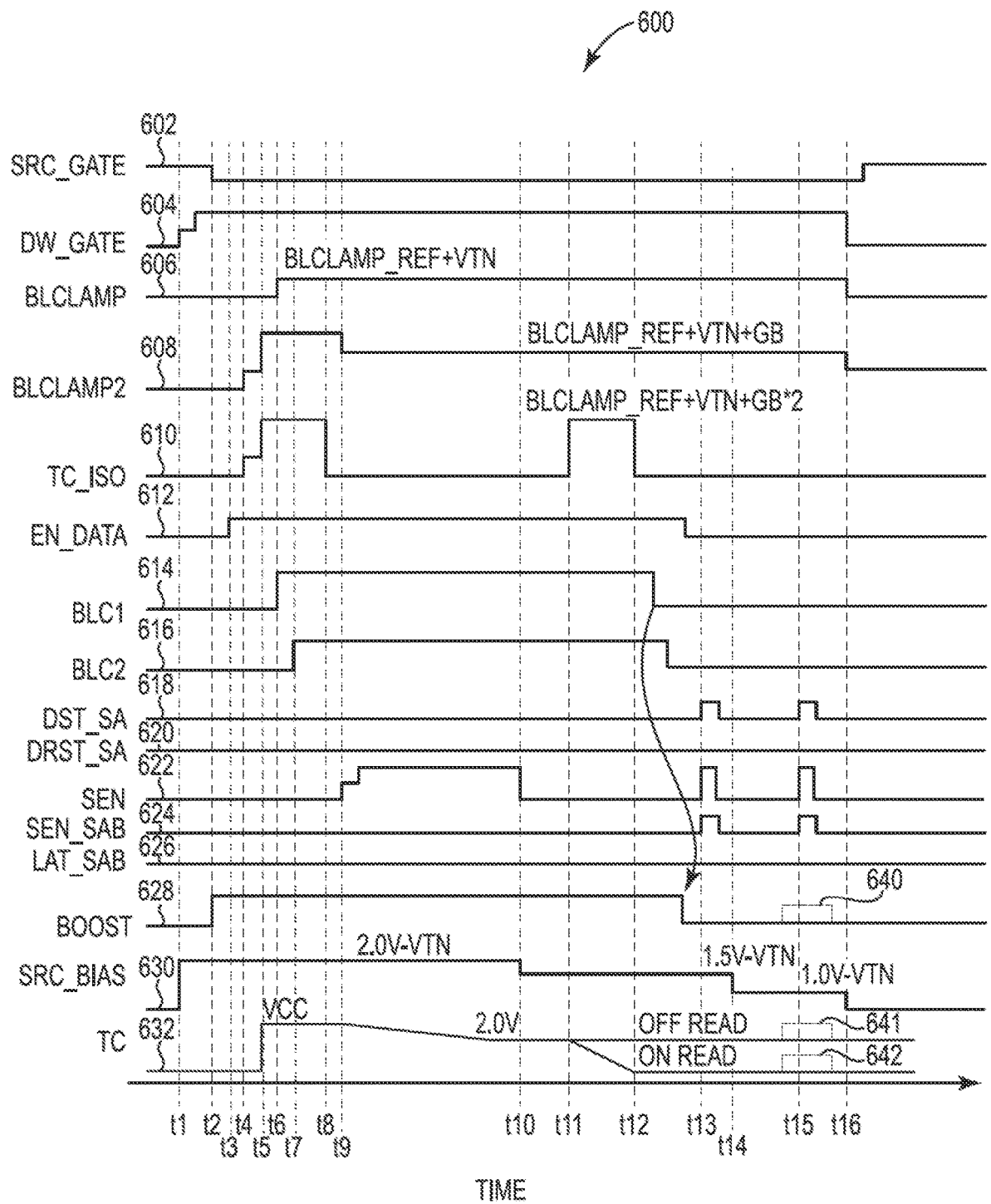
FIG. 6 is a timing diagram depicting a sensing operation according to other embodiments.

FIG. 6 is a timing diagram 600 depicting a sensing operation according to other embodiments. In FIG. 6, trace 602 might represent a SRC_GATE control signal on signal path 333 of FIGS. 3A and 3B. Trace 604 might represent a DW_GATE control signal on signal path 304 of FIGS. 3A and 3B. Trace 606 might represent a BLCLAMP control signal on signal path 312 of FIGS. 3A and 3B. Trace 608 might represent a BLCLAMP2 control signal on signal path 332 of FIGS. 3A and 3B. Trace 610 might represent a TC_ISO control signal on signal path 348 of FIGS. 3A and 3B. Trace 612 might represent an EN_DATA control signal on signal path 336 of FIGS. 3A and 3B. Trace 614 might represent a BLC1 control signal on signal path 364 of FIGS. 3A and 3B. Trace 616 might represent BLC2 control signal on signal path 397 of FIG. 3B. Trace 618 might represent a DST_SA control signal on signal path 376 of FIGS. 3A and 3B. Trace 620 might represent a DRST_SA control signal on signal path 375 of FIGS. 3A and 3B. Trace 622 might represent a SEN control signal on signal path 372 of FIGS. 3A and 3B. Trace 624 might represent a SEN_SAB control signal on signal path 385 of FIGS. 3A and 3B. Trace 626 might represent a LAT_SAB control signal on signal path 389 of FIGS. 3A and 3B. Trace 628 might represent a BOOST signal on node 358 of FIGS. 3A and 3B. Trace 630 might represent a SRC_BIAS signal on node 382 of FIGS. 3A and 3B as provided by the biasing circuit 400 of FIG. 4. Trace 632 might represent a TC signal on signal path 350 of FIGS. 3A and 3B.

Prior to time t1, a program pulse might be applied to memory cells connected to a selected access line. After the program pulse, a program verify operation might be implemented to determine whether each memory cell connected to the selected access line has been programed to their target level. The signal levels illustrated in FIG. 6 are applicable to either a sense operation corresponding to a program verify operation or a read operation to read data from the array of memory cells.

During the sense operation, DRST_SA and LAT_SAB might remain at a reference voltage (e.g., VSS). At time t1, DW_GATE might be increased to a voltage sufficient to activate the transistor 302 to connect the data line 204 to the signal path 306. Also at time t1, SCR_BIAS might be increased to a sense capacitor precharge voltage (e.g., 2.0V-Vtn, where Vtn is the threshold voltage of the sense transistor 378 of FIGS. 3A and 3B and the regulator transistor 418 of FIG. 4) to bias the source of transistor 378. At time t2, SRC_GATE might be decreased to a voltage sufficient to activate the select transistor 210 to connect the selected memory cell 208 to the common source 216. Also at time t2, BOOST might be increased (e.g., to 2.0V) to bias sense capacitor 354. At time t3, EN_DATA might be increased to a voltage sufficient to activate transistor 334 to connect signal path 314 to signal path 338. At time t4, BLCLAMP2 might be increased to a voltage sufficient to activate transistor 330 to connect signal path 326 to signal path 314. Also at time t4, TC_ISO might be increased to a voltage sufficient to activate transistor 346 to connect signal path 314 to TC signal path 350.

At time t5, TC might be charged to a precharge voltage (e.g., VCC). At time t6, BLCAMP might be increased to BLCLAMP_REF+Vtn to begin precharging the data line 204. Also at time t6, BLC1 might be increased to a voltage sufficient to activate transistor 362 to connect TC signal path 350 to signal path 366, which connects the first capacitance element 394 with sense capacitor 354. At time t7, BLC2 might be increased to a voltage sufficient to activate transistor 396 to connect signal path 366 to signal path 393, which connects the second capacitance element 398 with the first capacitance element 394 and the sense capacitor 354. For the embodiment of FIG. 3A where the second capacitance element 398 is not included, this step at time t7 may be skipped. At time t8, TC_ISO might be decreased to a voltage sufficient to deactivate transistor 346 to disconnect signal path 314 from TC signal path 350. At time t9, BLCLAMP2 might be decreased to BLCLAMP_REF+Vtn+ GB. Also at time t9, SEN might be increased to a voltage sufficient to activate transistor 370 to connect signal path 366 to signal path 374.

Between times t9 and t10, TC might be discharged to the voltage of SRC_BIAS (e.g., 2.0V). At time t10, SEN might be decreased to a voltage sufficient to deactivate transistor 370 to disconnect signal path 366 from signal path 374. Also at time t10, SRC_BIAS might be decreased to a target threshold voltage (e.g., 1.5V-Vtn) for a first sense operation (e.g., for a program verify or read strobe). At time t11, the precharging of the data line 204 is complete and TC_ISO might be increased to BLCLAMP_REF+Vtn+GB*2 to begin sensing the state of the selected memory cell.

Between times t11 and t12, in response to the selected memory cell being in an off state, TC remains substantially constant. In response to the selected memory cell being in an on state, TC is discharged through the selected memory cell. At time t12, the sensing is complete and TC_ISO might be decreased to a voltage sufficient to disconnect signal path 314 from TC signal path 350. Between times t12 and t13, EN_DATA, BLC1, and BLC2 might each be decreased to a voltage sufficient to deactivate transistors 334, 362, and 396, respectively. Also between times t12 and t13, BOOST might be decreased to a reference voltage (e.g., GND) after transistor 362 is deactivated. At time t13, DST_SA, SEN, and SEN_SAB might be pulsed to temporarily activate transistor 388, transistor 370, and inverter 383, respectively, to latch the state of the selected memory cell in sense amplifier latch 386 for a program verify or read operation. In response to TC indicating the memory cell is in an off state, the sense transistor 378 is activated and the sense amplifier latch 386 latches a "0" based on the voltage on signal path 366. In response to TC indicating the memory cell is in an on state, the sense transistor 378 is deactivated and the sense amplifier latch 386 latches a "1" based on the voltage on signal path 366.

Alternatively, at time t14 SCR_BIAS might be decreased to a target threshold voltage (e.g., 1.0V-Vtn) for a second sense operation (e.g., for a SSPC strobe). At time t15, DST_SA, SEN, and SEN_SAB then might be pulsed to temporarily activate transistor 388, transistor 370, and inverter 383, respectively, to latch the state of the selected memory cell in sense amplifier latch 386 for a selective slow program convergence operation. In one example prior to time t15, BOOST might be increased above a reference voltage as indicated at 640 to increase TC as indicated at 641 or 642 prior to latching the state of the selected memory cell in the sense amplifier latch 386 for the selective slow program convergence operation. By increasing BOOST to increase TC, an additional margin might be provided for latching the state the of selected memory cell in the sense amplifier latch 386 for the selective slow program convergence operation. At time t16, DW_GATE, BLCLAMP, and BLCLAMP2 might be decreased to a voltage sufficient to deactivate the transistors 302, 310, and 330, respectively.

Also at time t16, SRC_BIAS might be decreased to a reference voltage (e.g., GND). After time t16, SCR_GATE might be increased to deactivate the select transistor 210 and the sense operation is complete.

FIGS. 7A-7H are flowcharts of a method 700 of operating a memory in accordance with an embodiment. Method 700 may correspond at least in part to FIGS. 5 and 6. For example, FIG. 7A-7H might represent a method of sensing, e.g., reading or verifying, one or more memory cells, e.g., a logical page of memory cells. The method might be in the form of computer-readable instructions, e.g., stored to the instruction registers 128 of FIG. 1. Such computer-readable instructions might be executed by a controller, e.g., the control logic 116, to cause the memory device 100 to perform the method.

Figure 7A:
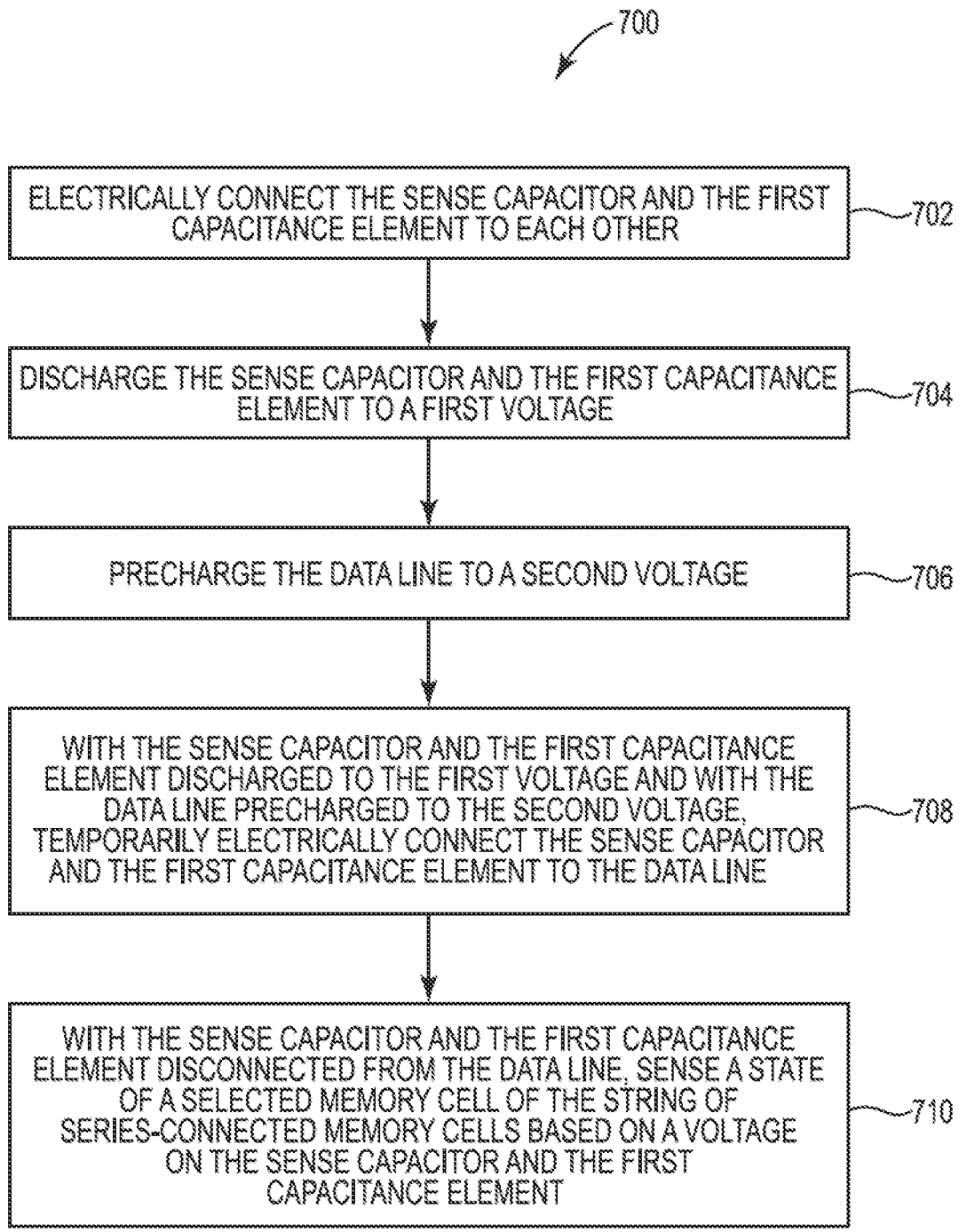
FIGS. 7A-7H are flowcharts of a method of operating a memory in accordance with an embodiment.

Method 700 might be implemented within a memory device (e.g., 100) including a string of series-connected memory cells (e.g., 206), a data line (e.g., 204) selectively connected to the string of series-connected memory cells, a sense capacitor (e.g., 354) selectively connected to the data line, a first capacitance element (e.g., 394) selectively connected to the sense capacitor, and control logic (e.g., 116) as previously described at least with reference to FIGS. 1-3B. As illustrated in FIG. 7A at 702, the control logic may electrically connect the sense capacitor and the first capacitance element to each other. At 704, the control logic may discharge the sense capacitor and the first capacitance element to a first voltage. At 706, the control logic may precharge the data line to a second voltage. At 708, the control logic may with the sense capacitor and the first capacitance element discharged to the first voltage and with the data line precharged to the second voltage, temporarily electrically connect the sense capacitor and the first capacitance element to the data line. At 710, the control logic may with the sense capacitor and the first capacitance element disconnected from the data line, sense a state of a selected memory cell of the string of series-connected memory cells based on a voltage on the sense capacitor and the first capacitance element.

Figure 7B:
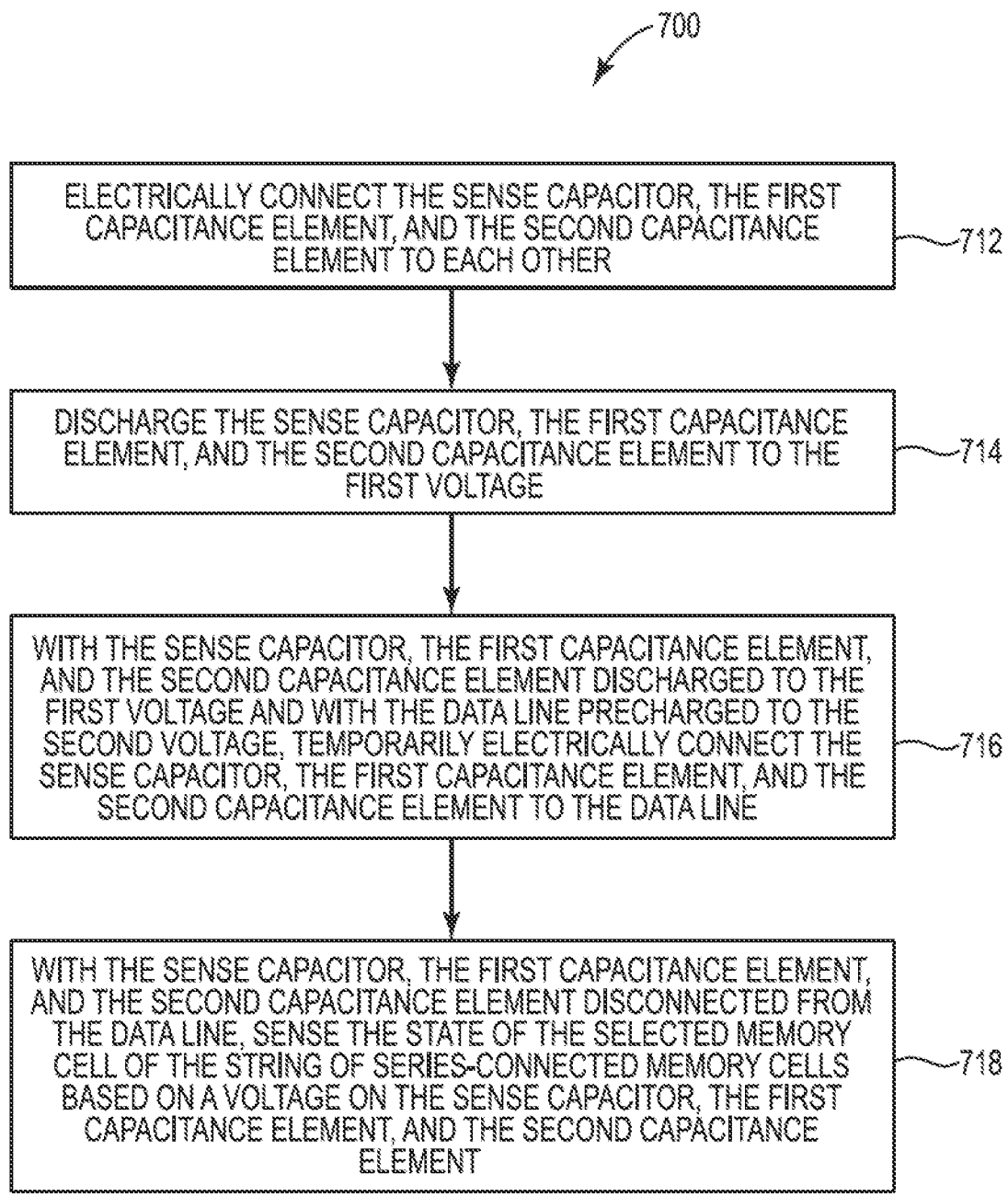

The memory device in which method 700 is implemented may further include a second capacitance element (e.g., 398) selectively connected to the first capacitance element. In one embodiment, the first capacitance element might include a first wire capacitance and the second capacitance element might include a second wire capacitance. As illustrated in FIG. 7B at 712, the control logic may further electrically connect the sense capacitor, the first capacitance element, and the second capacitance element to each other. At 714, the control logic may further discharge the sense capacitor, the first capacitance element, and the second capacitance element to the first voltage. At 716, the control logic may further with the sense capacitor, the first capacitance element, and the second capacitance element discharged to the first voltage and with the data line precharged to the second voltage, temporarily electrically connect the sense capacitor, the first capacitance element, and the second capacitance element to the data line. At 718, the control logic may further with the sense capacitor, the first capacitance element, and the second capacitance element disconnected from the data line, sense the state of the selected memory cell of the string of series-connected memory cells based on a voltage on the sense capacitor, the first capacitance element, and the second capacitance element.

Figure 7C:
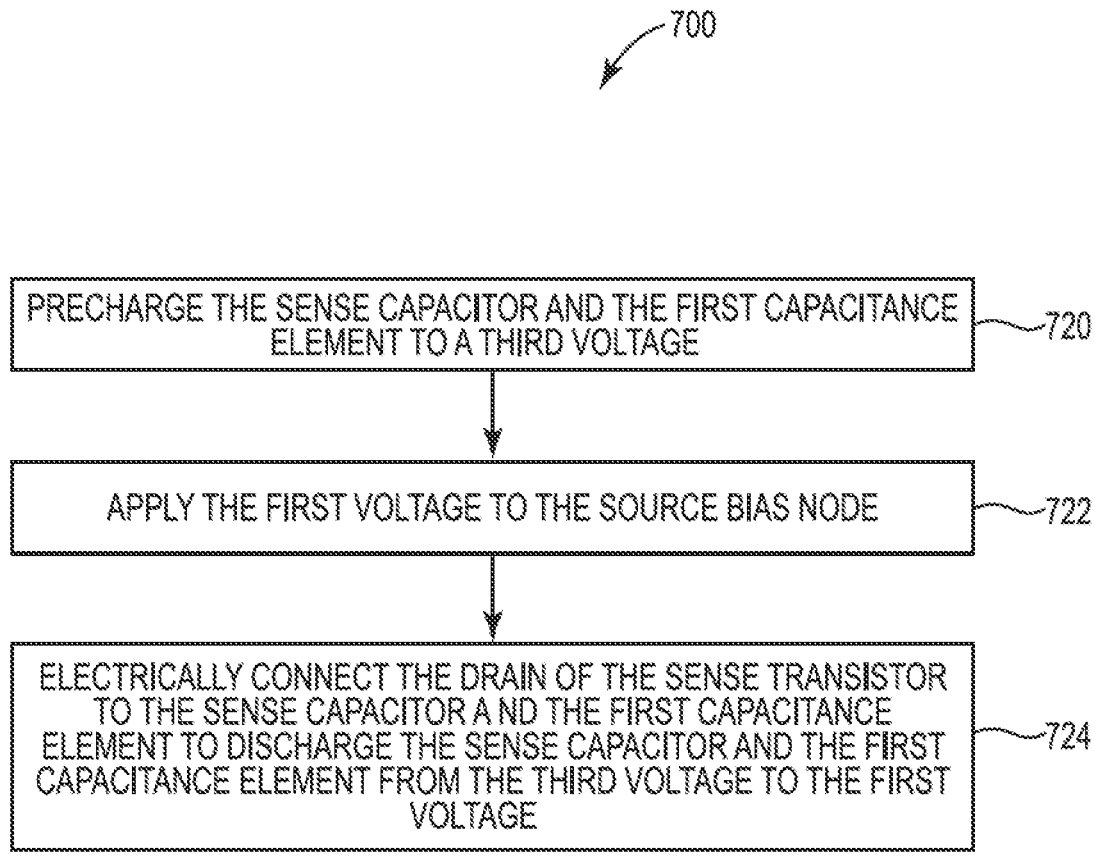

The memory device in which method 700 is implemented may further include a sense transistor (e.g., 378) comprising a gate connected to the sense capacitor, a drain selectively connected to the sense capacitor and the first capacitance element, and a source connected to a source bias node (e.g., 382). In this embodiment as illustrated in FIG. 7C at 720, the control logic may further precharge the sense capacitor and the first capacitance element to a third voltage. At 722, the control logic may further apply the first voltage to the source bias node. At 724, the control logic may further electrically connect the drain of the sense transistor to the sense capacitor and the first capacitance element to discharge the sense capacitor and the first capacitance element from the third voltage to the first voltage.

Figure 7D:
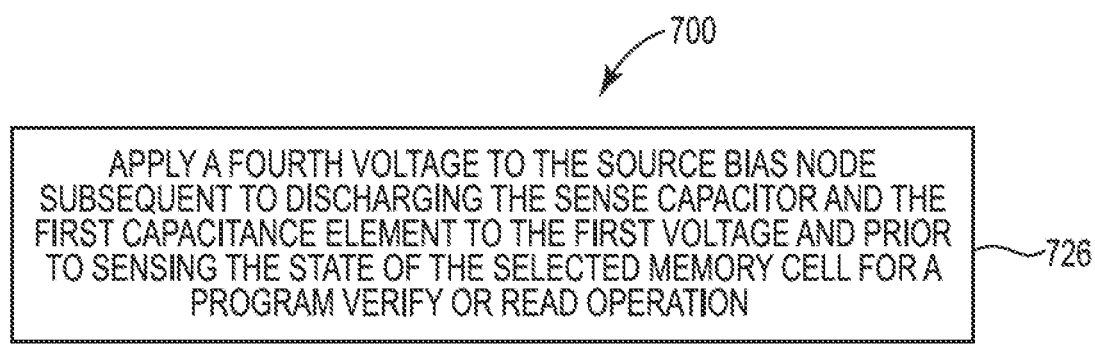

As illustrated in FIG. 7D at 726, the control logic may further apply a fourth voltage to the source bias node subsequent to discharging the sense capacitor and the first capacitance element to the first voltage and prior to sensing the state of the selected memory cell for a program verify or read operation.

Figure 7E:
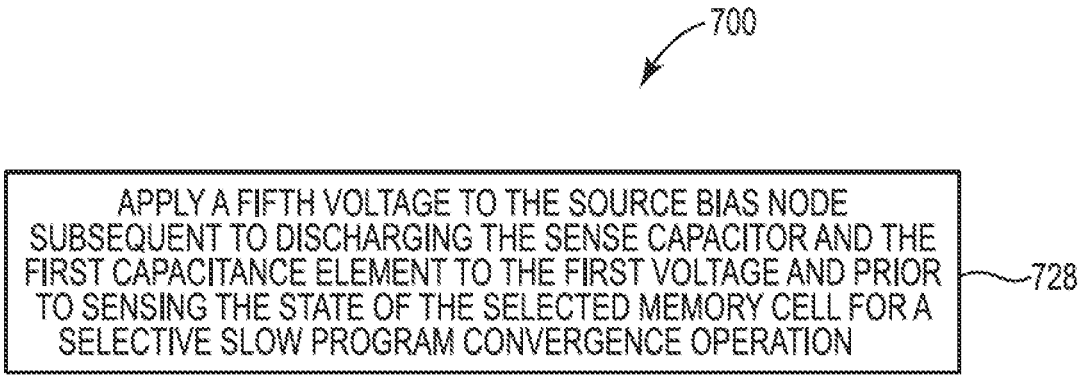

As illustrated in FIG. 7E at 728, the control logic may further apply a fifth voltage to the source bias node subsequent to discharging the sense capacitor and the first capacitance element to the first voltage and prior to sensing the state of the selected memory cell for a selective slow program convergence operation. In one embodiment, the first voltage might be greater than the fourth voltage, and the fourth voltage might be greater than the fifth voltage. In another embodiment, the first voltage might be a precharge voltage, the fourth voltage might be a first target threshold voltage for the sense transistor, and the fifth voltage might be a second target threshold voltage for the sense transistor.

The memory device in which method 700 is implemented may further include a first latch (e.g., 386) selectively connected to the sense transistor. In this embodiment, the control logic may further latch the sensed state of the selected memory cell in the first latch. The memory device in which method 700 is implemented may further include a second latch (e.g., 392) selectively connected to the first latch. The first capacitance element might be selectively connected between the sense capacitor and the second latch.

Figure 7F:
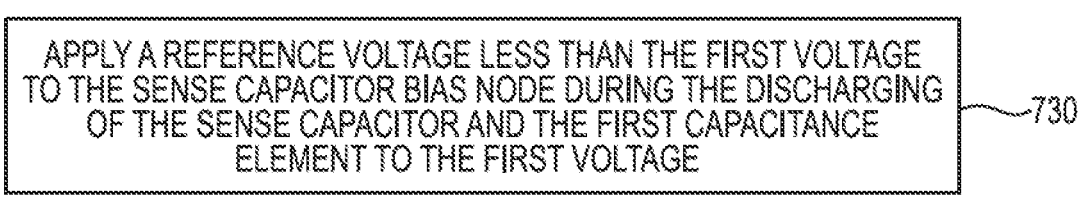
Figure 7G:
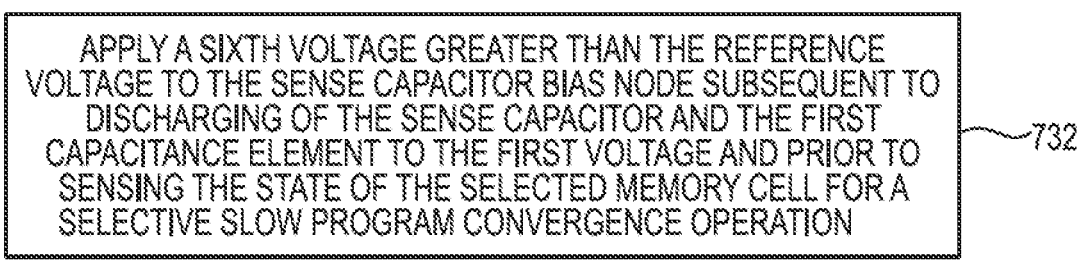

The sense capacitor might be connected to a sense capacitor bias node (e.g., BOOST node 358). In this embodiment as illustrated in FIG. 7F at 730, the control logic may further apply a reference voltage less than the first voltage to the sense capacitor bias node during the discharging of the sense capacitor and the first capacitance element to the first voltage. In one embodiment as illustrated in FIG. 7G at 732, the control logic may further apply a sixth voltage greater than the reference voltage to the sense capacitor bias node subsequent to discharging the sense capacitor and the first capacitance element to the first voltage and prior to sensing the state of the selected memory cell for a selective slow program convergence operation.

Figure 7H:
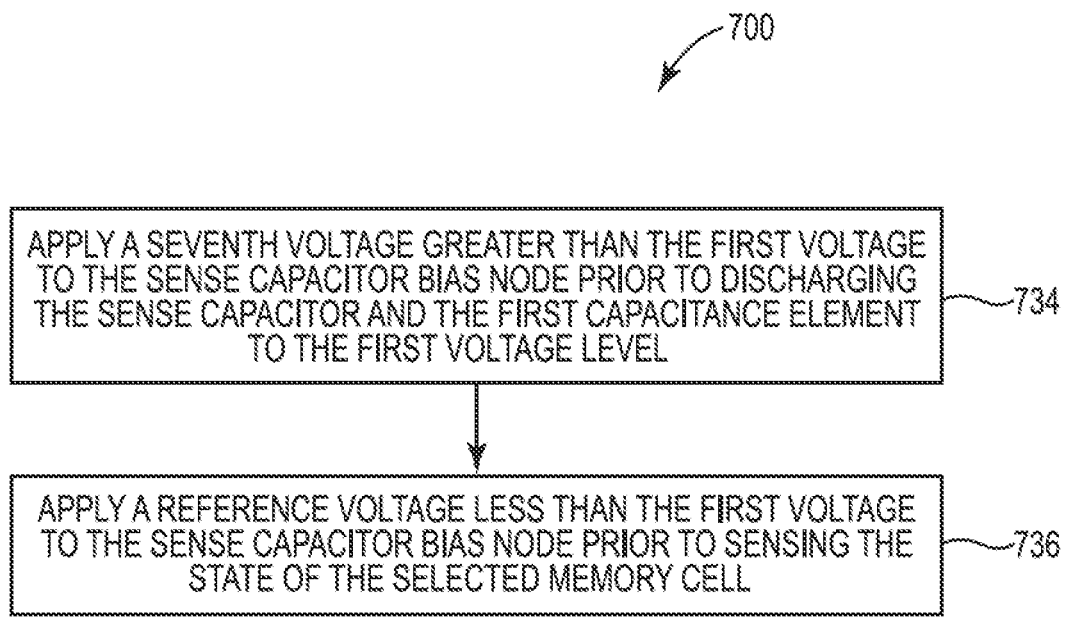

In another embodiment as illustrated in FIG. 7H at 734, the control logic may further apply a seventh voltage greater than the first voltage to the sense capacitor bias node prior to discharging the sense capacitor and the first capacitance element to the first voltage level. At 736, the control logic may further apply a reference voltage less than the first voltage to the sense capacitor bias node prior to sensing the state of the selected memory cell.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A memory device comprising:
a capacitor;
a first capacitance element;
a first transistor connected between the capacitor and the first capacitance element;
a second capacitance element; and
a second transistor connected between the first capacitance element and the second capacitance element; and
control logic connected to a control gate of the first transistor and to a control gate of the second transistor, the control logic configured to activate the first transistor and the second transistor to precharge the capacitor, the first capacitance element, and the second capacitance element during a read operation of the memory device.

2. The memory device of claim 1, wherein the first capacitance element comprises a wire capacitance of a first signal line.

3. The memory device of claim 2, further comprising:
a first latch connected to the first signal line; and
a second latch connected to the first signal line.

4. The memory device of claim 1, wherein the first capacitance element comprises a first wire capacitance of a first signal line and the second capacitance element comprises a second wire capacitance of a second signal line.

5. The memory device of claim 4, further comprising:
a first latch connected to the first signal line; and
a second latch connected to the second signal line.

6. The memory device of claim 1, further comprising:
a data line selectively connected to the capacitor; and
a string of series-connected memory cells selectively connected to the data line.

7. A memory device comprising:
a string of series-connected memory cells;
a data line selectively connected to the string of series-connected memory cells;
a sense capacitor selectively connected to the data line;
a first capacitance element selectively connected to the sense capacitor; and
control logic configured to:
electrically connect the sense capacitor and the first capacitance element to each other;
discharge the sense capacitor and the first capacitance element to a first voltage;
precharge the data line to a second voltage;
with the sense capacitor and the first capacitance element discharged to the first voltage and with the data line precharged to the second voltage, temporarily electrically connect the sense capacitor and the first capacitance element to the data line; and
with the sense capacitor and the first capacitance element disconnected from the data line, sense a state of a selected memory cell of the string of series-connected memory cells based on a voltage on the sense capacitor and the first capacitance element.

8. The memory device of claim 7, further comprising:
a second capacitance element selectively connected to the first capacitance element,
wherein the control logic is configured to:
electrically connect the sense capacitor, the first capacitance element, and the second capacitance element to each other;

discharge the sense capacitor, the first capacitance element, and the second capacitance element to the first voltage;

with the sense capacitor, the first capacitance element, and the second capacitance element discharged to the first voltage and with the data line precharged to the second voltage, temporarily electrically connect the sense capacitor, the first capacitance element, and the second capacitance element to the data line; and with the sense capacitor, the first capacitance element, and the second capacitance element disconnected from the data line, sense the state of the selected memory cell of the string of series-connected memory cells based on a voltage on the sense capacitor, the first capacitance element, and the second capacitance element.

9. The memory device of claim 8, wherein the first capacitance element comprises a first wire capacitance and the second capacitance element comprises a second wire capacitance.

10. The memory device of claim 7, further comprising:
a sense transistor comprising a gate connected to the sense capacitor, a drain selectively connected to the sense capacitor and the first capacitance element, and a source connected to a source bias node,
wherein the control logic is configured to:
precharge the sense capacitor and the first capacitance element to a third voltage;
apply the first voltage to the source bias node; and
electrically connect the drain of the sense transistor to the sense capacitor and the first capacitance element to discharge the sense capacitor and the first capacitance element from the third voltage to the first voltage.

11. The memory device of claim 10, wherein the control logic is configured to apply a fourth voltage to the source bias node subsequent to discharging the sense capacitor and the first capacitance element to the first voltage and prior to sensing the state of the selected memory cell for a program verify or read operation.

12. The memory device of claim 11, wherein the control logic is configured to apply a fifth voltage to the source bias node subsequent to discharging the sense capacitor and the first capacitance element to the first voltage and prior to sensing the state of the selected memory cell for a selective slow program convergence operation.

13. The memory device of claim 12, wherein the first voltage is greater than the fourth voltage, and the fourth voltage is greater than the fifth voltage.

14. The memory device of claim 12, wherein the first voltage comprises a precharge voltage, the fourth voltage comprises a first target threshold voltage for the sense transistor, and the fifth voltage comprises a second target threshold voltage for the sense transistor.

15. The memory device of claim 7, further comprising:
a first latch selectively connected to the sense transistor, wherein the control logic is configured to latch the sensed state of the selected memory cell in the first latch.

16. The memory device of claim 15, further comprising:
a second latch selectively connected to the first latch, wherein the first capacitance element is selectively connected between the sense capacitor and the second latch.

17. The memory device of claim 7, wherein the sense capacitor is connected to a sense capacitor bias node, and wherein the control logic is configured to apply a reference voltage less than the first voltage to the sense capacitor bias node during the discharging of the sense capacitor and the first capacitance element to the first voltage.

18. The memory device of claim 17, wherein the control logic is configured to apply a sixth voltage greater than the reference voltage to the sense capacitor bias node subsequent to discharging of the sense capacitor and the first capacitance element to the first voltage and prior to sensing the state of the selected memory cell for a selective slow program convergence operation.

19. The memory device of claim 7, wherein the sense capacitor is connected to a sense capacitor bias node, and wherein the control logic is configured to:
apply a seventh voltage greater than the first voltage to the sense capacitor bias node prior to discharging the sense capacitor and the first capacitance element to the first voltage level; and
apply a reference voltage less than the first voltage to the sense capacitor bias node prior to sensing the state of the selected memory cell.

20. A memory device comprising:
a string of series-connected memory cells;
a data line selectively connected to the string of series-connected memory cells;
a page buffer connected to the data line, wherein the page buffer comprises:
a sense transistor comprising a gate, a drain, and a source, the gate and the drain selectively connected to the data line; and
a first multiplexer comprising an output connected to the drain of the sense transistor, a first input connected to a first bias node, and a second input connected to a second bias node.

21. The memory device of claim 20, wherein the first multiplexer comprises a third input connected to a third bias node.

22. The memory device of claim 20, wherein the page buffer further comprises:
a voltage regulator configured to apply a regulated voltage to the first bias node based on a selected one of a plurality of input voltages to the voltage regulator.

23. The memory device of claim 22, wherein the voltage regulator comprises:
an operational amplifier comprising an output connected to the first bias node;
a current source; and
a regulator transistor connected to the current source and the operational amplifier, the regulator transistor comprising a threshold voltage equal to a threshold voltage of the sense transistor such that the regulated voltage applied to the first bias node equals the selected one of the plurality of input voltages minus the threshold voltage of the regulator transistor.

24. The memory device of claim 23, wherein the threshold voltage of the regulator transistor and the threshold voltage of the sense transistor remain equal in response to process, voltage, and temperature variations.

25. The memory device of claim 23, wherein the voltage regulator further comprises:
a second multiplexer comprising an output connected to a first input of the operational amplifier, a first input connected to a first input voltage node, a second input connected to a second input voltage node, and a third input connected to a third input voltage node,
wherein a second input of the operational amplifier is connected to the current source and the regulator transistor.

26. The memory device of claim 25, wherein the third input voltage node is to be biased to a sense capacitor precharge voltage, the second input voltage node is to be biased to a target threshold voltage for a first sense operation, and the first input voltage node is to be biased to a target threshold voltage for a second sense operation.

27. The memory device of claim 20, wherein the page buffer further comprises:
a sense capacitor selectively connected to the data line;
a first capacitance element selectively connected to the sense capacitor; and
a second capacitance element selectively connected to the first capacitance element.

28. A memory device comprising:
an array of memory cells comprising a plurality of strings of series-connected memory cells;
a plurality of data lines, wherein each string of series-connected memory cells of the plurality of strings of series-connected memory cells is selectively electrically connected to a respective data line of the plurality of data lines; and
a page buffer connected to the plurality of data lines, wherein for each data line of the plurality of data lines the page buffer comprises:
a sense transistor comprising a gate and a drain selectively connected to the data line;
a first multiplexer comprising an output connected to a drain of the sense transistor, a first input connected to a first bias node, and a second input connected to a second bias node configured to receive a reference voltage; and
a voltage regulator to apply a regulated voltage to the first bias node based on a selected one of a plurality of input voltages to the voltage regulator.

29. The memory device of claim 28, wherein the voltage regulator is configured to apply a first voltage to the first bias node during a data line precharge period, apply a second voltage to the first bias node during a program verify or read strobe, and apply a third voltage to the first bias node during a selective slow program convergence strobe.

30. The memory device of claim 29, wherein the first voltage is greater than the second voltage, the second voltage is greater than the third voltage, and the third voltage is greater than the reference voltage.

31. The memory device of claim 28, wherein for each data line of the plurality of data lines the page buffer further comprises:
a sense capacitor selectively connected to the data line; and
a first capacitance element selectively connected to the sense capacitor.

32. A page buffer for a memory device, the page buffer comprising:
a sense capacitor;
a first signal line comprising a first wire capacitance;
a second signal line comprising a second wire capacitance;
a first transistor connected between the sense capacitor and the first signal line;
a second transistor connected between the first signal line and the second signal line;
a sense transistor comprising a gate, a drain, and a source, the gate connected to the sense capacitor and the drain selectively connected to the first signal line; and
a first multiplexer comprising an output connected to the drain of the sense transistor, a first input connected to a first bias node, and a second input connected to a second bias node.

33. The page buffer of claim 32, wherein the first wire capacitance is less than a capacitance of the sense capacitor and the second wire capacitance is less than the capacitance of the sense capacitor.

34. The page buffer of claim 32, further comprising:
a first latch connected to the first signal line; and
a second latch connected to the second signal line.

35. The page buffer of claim 32, further comprising:
a voltage regulator to apply a regulated voltage to the first bias node based on a selected one of a plurality of input voltages to the voltage regulator.

36. The page buffer of claim 35, wherein the voltage regulator comprises:
an operational amplifier comprising an output connected to the first bias node,
a current source, and
a regulator transistor connected to the current source and the operational amplifier, the regulator transistor comprising a threshold voltage equal to a threshold voltage of the sense transistor such that the regulated voltage applied to the first bias node equals the selected one of the plurality of input voltages minus the threshold voltage of the regulator transistor.

37. The page buffer of claim 36, wherein the threshold voltage of the regulator transistor and the threshold voltage of the sense transistor remain equal in response to process, voltage, and temperature variations.

38. The page buffer of claim 36, wherein the voltage regulator further comprises:
a second multiplexer comprising an output connected to a first input of the operational amplifier, a first input connected to a first input voltage node, a second input connected to a second input voltage node, and a third input connected to a third input voltage node,
wherein a second input of the operational amplifier is connected to the current source and the regulator transistor.

* * * * *